(12) United States Patent
Yang et al.

(10) Patent No.: US 7,805,664 B1
(45) Date of Patent: Sep. 28, 2010

(54) LIKELIHOOD METRIC GENERATION FOR TRELLIS-BASED DETECTION AND/OR DECODING

(75) Inventors: Shaohua Yang, San Jose, CA (US); Zining Wu, Los Altos, CA (US)

(73) Assignee: Marvell International Ltd, Hamilton (BM)

( * ) Notice: Subject to any disclaimer, the term of this patent is extended or adjusted under 35 U.S.C. 154(b) by 423 days.

(21) Appl. No.: 11/865,627

(22) Filed: Oct. 1, 2007

Related U.S. Application Data

(60) Provisional application No. 60/828,334, filed on Oct. 5, 2006.

(51) Int. Cl.
*H03M 13/03* (2006.01)
(52) U.S. Cl. ............... 714/794; 714/795; 714/796; 375/261; 375/341
(58) Field of Classification Search ......... 714/794–796; 375/262, 341
See application file for complete search history.

(56) References Cited

U.S. PATENT DOCUMENTS

| | | | |
|---|---|---|---|
| 5,844,741 A * | 12/1998 | Yamakawa et al. ............ 360/65 |
| 6,003,153 A * | 12/1999 | Shimoda ..................... 714/792 |
| 6,154,870 A * | 11/2000 | Fredrickson et al. ........ 714/786 |
| 6,587,987 B1 * | 7/2003 | Vasic et al. .................. 714/780 |
| 6,791,776 B2 * | 9/2004 | Kato et al. ..................... 360/39 |
| 6,980,385 B2 * | 12/2005 | Kato et al. ..................... 360/39 |
| 7,012,974 B1 * | 3/2006 | Liu et al. ..................... 375/340 |
| 7,089,483 B2 * | 8/2006 | McEwen et al. ............ 714/795 |
| 7,164,371 B2 * | 1/2007 | Lee et al. ....................... 341/58 |
| 7,263,652 B2 * | 8/2007 | Zaboronski et al. ......... 714/794 |
| 7,646,806 B2 * | 1/2010 | Cohen ........................ 375/231 |
| 2006/0174183 A1 * | 8/2006 | Ashley et al. ............... 714/792 |

* cited by examiner

*Primary Examiner*—Esaw T Abraham

(57) ABSTRACT

Systems and methods for generating likelihood metrics for trellis-based detection and/or decoding are described. In some embodiments, likelihood metrics for a first subset of bit locations in an error pattern (e.g., bit locations that fall within the error event update window) are updated based on a first metric, such as the path metric difference, associated with an alternate path that converges to the same trellis state as the decoded sequence. In some embodiments, likelihood metrics for a second subset of bit locations in the error patterns (e.g., bit locations that do not fall within the error event update window) are updated based on a second metric, such as a predetermined value of zero, a small metric, or the path metric difference for a path that does not converge into the same winning state as the decoded sequence for the particular error update window of interest.

25 Claims, 19 Drawing Sheets

LIKELIHOOD METRIC GENERATION FOR TRELLIS-BASED DETECTION AND/OR DECODING

CROSS-REFERENCE TO RELATED APPLICATIONS

This application claims the benefit under 35 U.S.C. §119(e) of U.S. Provisional Application No. 60/828,334, filed Oct. 5, 2006.

This application is related to U.S. Patent Application Ser. No. 11/518,020, filed Sep. 8, 2006. The disclosures of these applications are hereby incorporated herein by reference in their entirety.

BACKGROUND OF THE INVENTION

This invention relates generally to systems, methods, apparatuses for digital signal detection and/or decoding, and more particularly, to generating likelihood metrics for trellis-based detection and/or decoding.

With continuing demand for high-speed digital communications systems and high-density digital storage systems, various techniques have been applied to increase the capacity of these systems. For example, in magnetic media storage, many manufacturers are using perpendicular recording, rather than traditional longitudinal recording, to pack more information into a smaller area. However, as data speeds and storage densities are pushed to their limits, the amount of signal distortion on information-carrying signals have increased dramatically and detectors/decoders are heavily relied upon to interpret the information in these distorted signals.

Various sources of noise, such as thermal noise interference, and media noise arising from sources such as, jitter, may distort accurate information in digital communication and storage systems. In addition to distortions from these sources, communication and storage systems may be affected by amplitude defects, which may change the magnitude to the communicated signals and introduce further ambiguity in the detection/decoding of these signals.

Detectors and decoders may account for these ambiguities by producing reliability metrics or likelihood metrics for the detected or decoded information. These metrics may, in turn, be used by post-detection or decoding systems to process the detected or decoded information. However, known computations of likelihood metrics are typically only effective when errors are contained within code words or predetermined error update windows. As a result, they may fail to accurately predict the reliability of the detection when the communication channel is affected by certain types of defects that may cause errors that span multiple code words or multiple such predetermined error update windows.

In particular, known computations of likelihood metrics in trellis-based decoding or detection may rely solely on the metrics associated with trellis paths that converge to the same final state or bit as the decoded sequence. Therefore, metrics associated with potentially accurate sequences that fail to converge to the same final state as the decoded sequence, often due to distortions resulting from severe defects in a communication or storage channel, are ignored when computing the likelihood metric for the decoded sequence. In practice, this has an effect of producing likelihood metrics that overestimate the reliability the detection, especially when a majority of the bits in the channel are defective. Furthermore, in some scenarios, unreliable likelihood metrics may lead to catastrophic errors in the communication or storage system if, for example, they cause a subsequent processing or decoding stage to utilize faulty sequences that may have been discarded or processed differently given a more accurate likelihood metric. Therefore, it is desirable to provide techniques for providing more accurate likelihood metrics for trellis-based decoding or detection.

SUMMARY OF THE INVENTION

Systems and methods are provided for generating more accurate likelihood metrics for trellis-based detection and/or decoding by using metrics associated with converging paths as well as other metrics, such as those associated with non-converging paths, to generate likelihood metrics for the decoded bits. By so doing, the present invention advantageously produces likelihood metrics that more accurately reflect the reliability of the detection, especially in case of defective bits. Furthermore, the present invention improves the accuracy of the likelihood metrics for these bits without substantial adverse effects on the likelihood metrics of otherwise non-defective bits.

In accordance with the principles of the invention, a modified method for computing likelihood metrics for decoded bits is provided. In some embodiments, likelihood metrics may be associated with error patterns generated for the decoded bits. Error patterns for the decoded bits may be generated by first identifying alternate paths that converge to the same state as the decoded bit sequence. Bit sequences associated with each of the alternate paths may then be compared to the decoded bit sequence, and the difference generated using, for example, a per-bit XOR operation, to obtain the error patterns. In these embodiments, bit locations in the error pattern where the decision from the alternate path differs from the decision from the decoded bit sequence are marked by a mask bit of "1," and these locations may represent error locations in the error pattern.

In some embodiments, likelihood metrics for the error patterns may be generated by an error event generator using at least two metrics. In particular, the error event generator may separate bits in each error pattern into two categories: a first subset of bits that fall within a predetermined error event update window and a second subset of bits that fall outside of the error event update window, with the more recent bits in the error pattern falling within the error event update window. The error event generator may generate likelihood metrics for the first subset of bit locations in the error patterns (i.e., the bit locations that fall within the error event update window) based on a first metric, and may generate likelihood metrics for the second subset of bit locations in the error patterns (i.e., the bit locations that do not fall within the error event update window) based on a second metric.

In some embodiments, the first metric may be based on an alternate path in the trellis for the decoded bit sequence. In particular, the first metric may be the path metric difference associated with a trace-back path in the trellis. In some embodiments, the trace-back path may be any alternate path that ends at the same winning state as the decoded sequence through a branch that is not the winning branch to that winning state.

In some embodiments, the second metric may be a predetermined value such as zero or some other small metric. Alternatively, the second metric may be based on a second alternate path that does not converge into the same winning state as the decoded sequence. In these embodiments, the second metric may be the path metric difference between the second alternate path and the winning path corresponding to the decoded sequence. In some embodiments, the second alternate path may be selected based on path metrics for paths in the trellis. For example, the second alternate path may be the path with the second lowest path metric, and therefore, the second best path, in the trellis. By updating the likelihood metrics for error patterns based on path metrics for selected potential paths that have not necessarily converged into the same winning state as the decoded sequence, the overall likelihood metric indicating the reliability of the detection may be adjusted to account for defects in the received signals that may be preventing convergence of these potential paths.

In some embodiments, the likelihood metric for a bit location in the second subset of bit locations may be updated only if the winning path decision for that bit location differs from the second alternate path decision for the same bit location.

Further features of the invention, its nature and various advantages, will be more apparent from the accompanying drawings and the following detailed description of the various embodiments.

DETAILED DESCRIPTION

The present invention provides systems and methods for identifying potential error locations, error patterns, and error likelihood metrics in connection with trellis-based detection/decoding. The present invention also provides a system and method for computing soft reliability information for each detected/decoded bit or codeword syndrome value. As used herein, the term "information" will refer to binary digits that may be physically embodied in many ways that are known in the art. In the case of convolutional encoding, information to be encoded will be referred to herein as "user information," and information produced by an encoder based on user information will be referred to as "parity information." User information may include information that has already been encoded by some type of encoder.

Figure 1A:
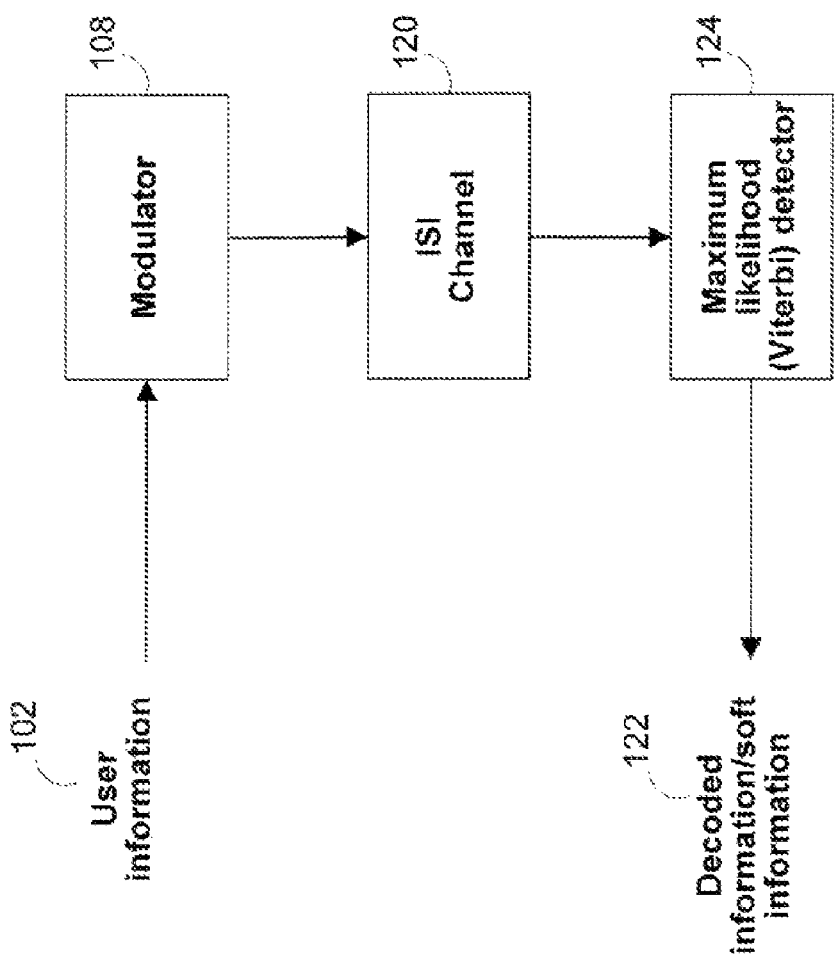
FIG. 1A is an illustrative block diagram of an exemplary system that includes an ISI channel.

FIG. 1A shows an exemplary communication/storage system that includes inter-symbol interference (ISI) channel 120. ISI refers to a form of distortion of a signal that causes previously transmitted symbols to have an effect on a currently received symbol. This is usually an unwanted phenomenon as the previous symbols have similar effect as noise, thus making the communication less reliable. In keeping with this phenomenon, outputs of ISI channel 120 may depend, not only on the most recent input to the channel, but also on past inputs. The system includes user information 102 intended for communication/storage. User information 102 may be modulated by modulator 108, which may perform electric-, magnetic-, or optical-based modulation, or another type of modulation. Modulator 108 transforms the user information into signals (not shown), which are received by ISI channel 120. Maximum-Likelihood (Viterbi) detector 124 receives the signals at the output of ISI channel 120 and produces decoded information and/or soft information 122 (not shown) based on the ISI channel's output signals. If there are no errors in decoded information 122, decoded information 122 will be the same as user information 102.

Figure 1B:
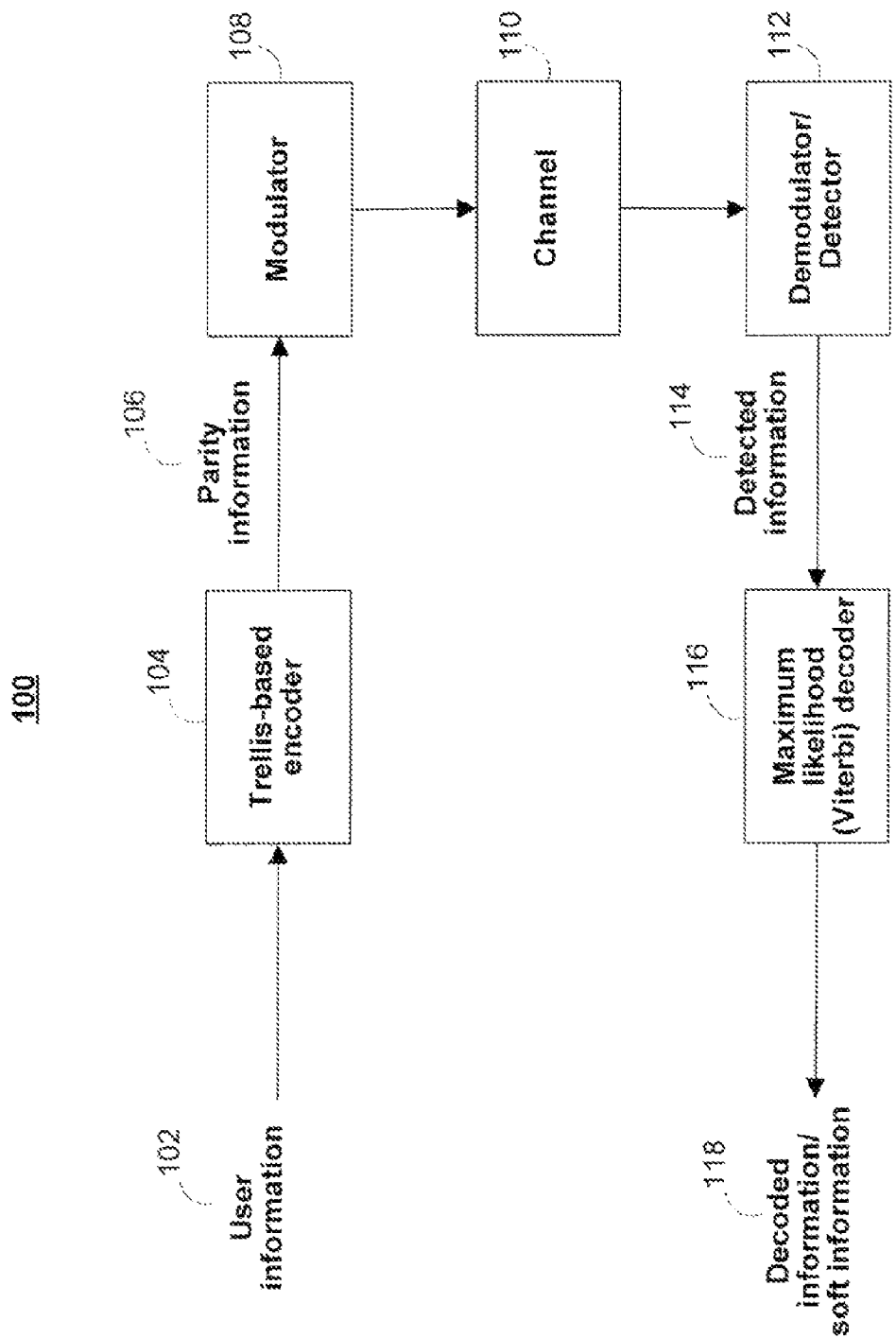
FIG. 1B is an illustrative block diagram of an exemplary system that uses a trellis-based code.

FIG. 1B shows an exemplary communication/storage system 100 that employs a trellis-based code. User information 102 intended for communication/storage may be encoded by trellis-based encoder 104 to generate parity information 106. Trellis-based encoder 104 introduces additional information to user information 102 such that there is a greater number of bits in parity information 106 than in user information 102. In some embodiments, a portion of parity information 106 may include user information 102. In this case, the encoder is known as a "systematic" encoder. From this point on, for ease of explanation, it will be assumed that trellis-based encoder 104 is not a systematic encoder. Therefore, the entire output of trellis-based encoder 104 will be referred to as parity information/bits 106. However, the present invention may be applied to systematic encoders as well. Although illustrative system 100 shows a trellis-based encoder 104, other encoders (for example, linear block encoders) can be used as long as a trellis-based based decoder can be used for decoding such codes.

In system 100, modulator 108 configures parity information 106 into a signal, which is passed to channel 110. As used herein, the term "channel" refers to the media, devices, and/or processing stages that occur between modulator 108 and detector/demodulator 112 and may correspond to a particular path of media/devices through which a signal may flow, a particular wavelength or time slot which a signal may utilize, and/or another multiple access scheme. For example, in FIG.

1B, channel 110 may correspond to storage and write and read components of a disk drive, including a magnetic storage medium, a disk-drive read/write head, and other storage system components. In some cases, the term "channel" as used herein may also include modulator 108 and demodulator/detector 112. While in channel 110, the signal may encounter error-producing phenomena, such as device physical failure, device electrical failure, signal interference, and/or data loss due to buffer overflow, for example. The interference signals and other error-producing phenomena in channel 110 will be referred to herein as "noise." As shown by the description above, the terms channel and noise are more conceptual than physical, but they correspond to physical aspects of a system. Various modulation/demodulation technologies may be used. For example, in some embodiments, encoder 104 and modulator 108 may be combined in a technology known as "trellis-coded modulation."

With continuing reference to FIG. 1B, the signal on channel 110 may be received by demodulator/detector 112. Demodulator/detector 112 may produce detected information 114 based on the received signal from channel 110. If there are no errors in detected information 114, the detected information should be the same as parity information 106. If there are errors, however, maximum likelihood (Viterbi) decoder 116 may be able to correct some or all of the errors using any suitable detection algorithm such as, the maximum-likelihood detection algorithm. If decoder 116 is able to correct all of the errors, decoded information 118 will be the same as user information 102. Otherwise, decoded information 118 will be different from user information 102. In this case, another layer of error-correction coding may be helpful, and one example will be described later herein in connection with FIG. 10.

Figure 2:
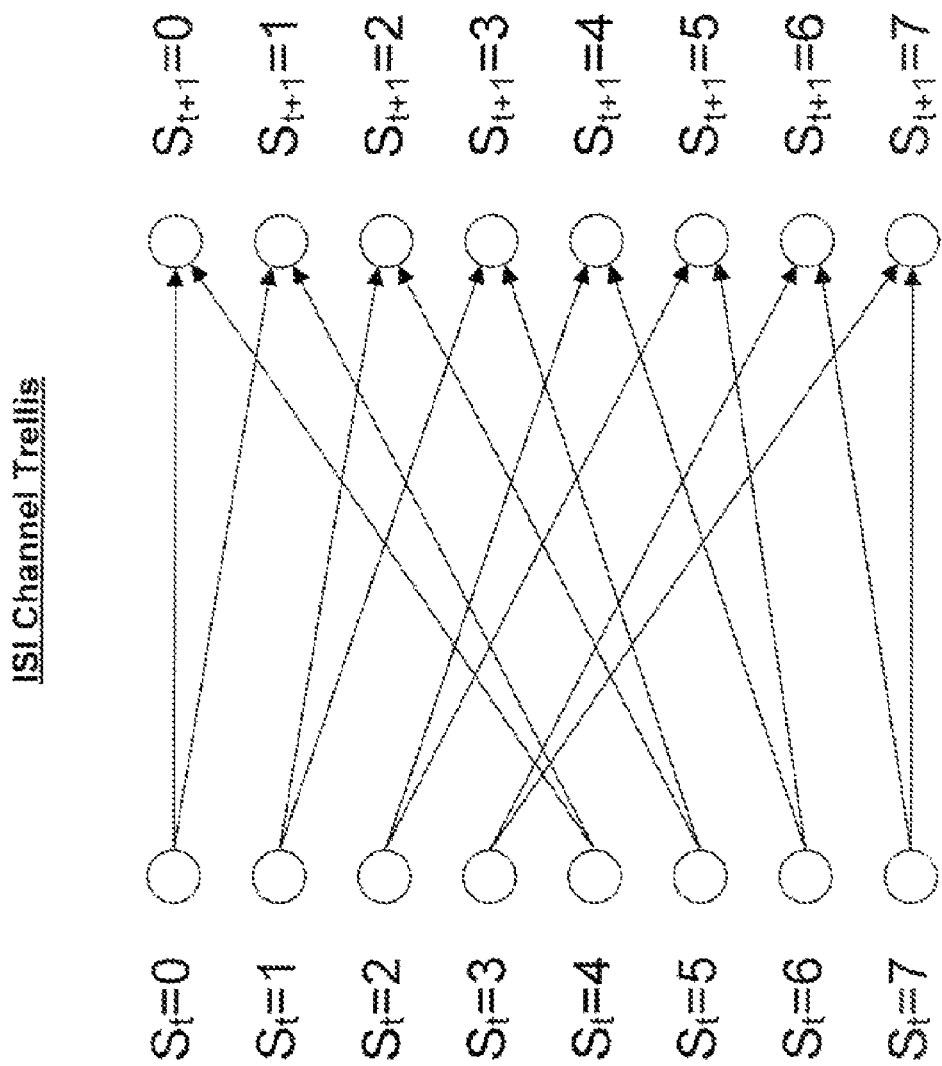
FIG. 2 is an illustrative diagram of an exemplary trellis state diagram corresponding to an ISI channel.

Referring now to the illustrative system of FIG. 1A, the operation of an ISI channel may be illustrated with reference to a channel input signal $x_t$, where t is the time index of the signal, and an exemplary trellis diagram shown in FIG. 2. In this example, the channel inputs are binary $x_t=+1$ or $-1$. I is understood that the channel inputs may be any suitable set of inputs. For example, in some embodiments, the channel inputs may not be binary.

Continuing with the example above, the equalized channel response (assuming a 4-tap target) will be $f=[f_0, f_1, f_2, f_3]$. The channel signal would then be $\hat{y}_t=x_t*f_0+x_{t-1}*f_1+x_{t-2}*f_2+x_{t-3}*f_3+n_t$, where $n_t$ is the channel noise. Channel noise may also be uncorrelated in time, i.e., white noise. The illustrative trellis diagram of FIG. 2 includes eight states. Each state $S_t$ corresponds to the three most recent channel input bits, $[x_{t-2}, x_{t-1}, x_t]$. Each state $S_t$ may have one of eight different values depending on the values of the channel input bits. The following is a list of the eight different state values and corresponding index values assigned to each of the states

[0, 0, 0]-0
[0, 0, 1]-1
[0, 1, 0]-2
[0, 1, 1]-3
[1, 0, 0]-4
[1, 0, 1]-5
[1, 1, 0]-6
[1, 1, 1]-7.

As illustrated in the trellis diagram, the states at time t are connected to states at time t+1, which are further connected to states at time t+2 (not shown), etc. Since the states are defined as $S_t=[x_{t-2}, x_{t-1}, x_t]$ and $S_{t+1}=[x_{t-1}, x_t, x_{t+1}]$, a valid state transition (i.e., trellis branch) between time t and t+1 requires that the connected states $S_t$ and $St_{+1}$ have the same values for $x_{t-1}$ and $x_t$.

The trellis branch connecting states $S_t$ and $S_{t+1}$ has input signal $x_{t+1}$ and output signal $\hat{y}_t=x_{t+1}*f_0+x_{t*f1 \neq +xt-1}*f_2+x_{t-2}*f_3$. In this illustrative channel, there may be 16 different trellis branches with different branch output values. For each trellis branch, the branch metric may be computed as $(y_{t+1}-\hat{y}_{t+1})^2$, where $y_{t-1}$ is the received noisy signal. If the channel noise were correlated in time, more states would generally be required to take this noise correlation into account. The trellis branch metric computation may also need an extra noise compensation (or whitening) filter. In some embodiments, the trellis branch output signal $\hat{y}_{t-1}$ may be a nonlinear function of channel inputs and the noise statistics may also vary for different trellis branches. For this kind of nonlinear signal or data-dependent noise channels, the branch metric may be computed based on the nonlinear signal and variant noise statistics.

Figure 3A:
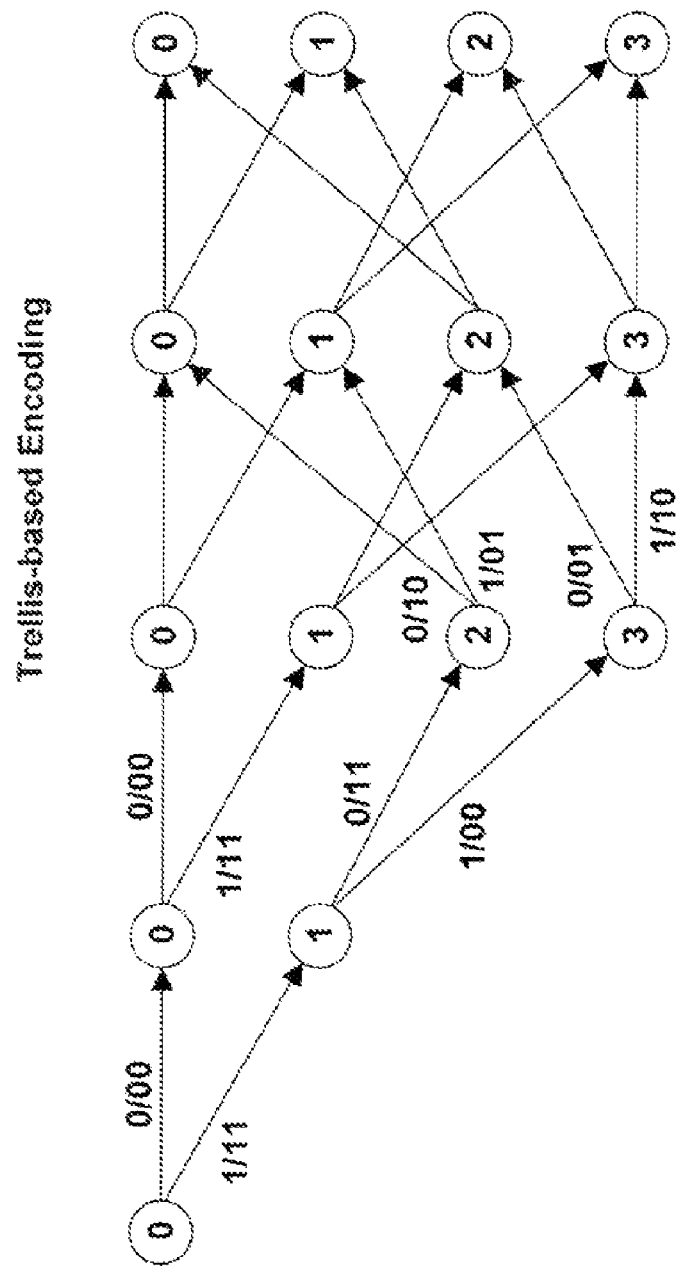
FIG. 3A is an illustrative trellis diagram of an exemplary trellis-based code.
Figure 3B:
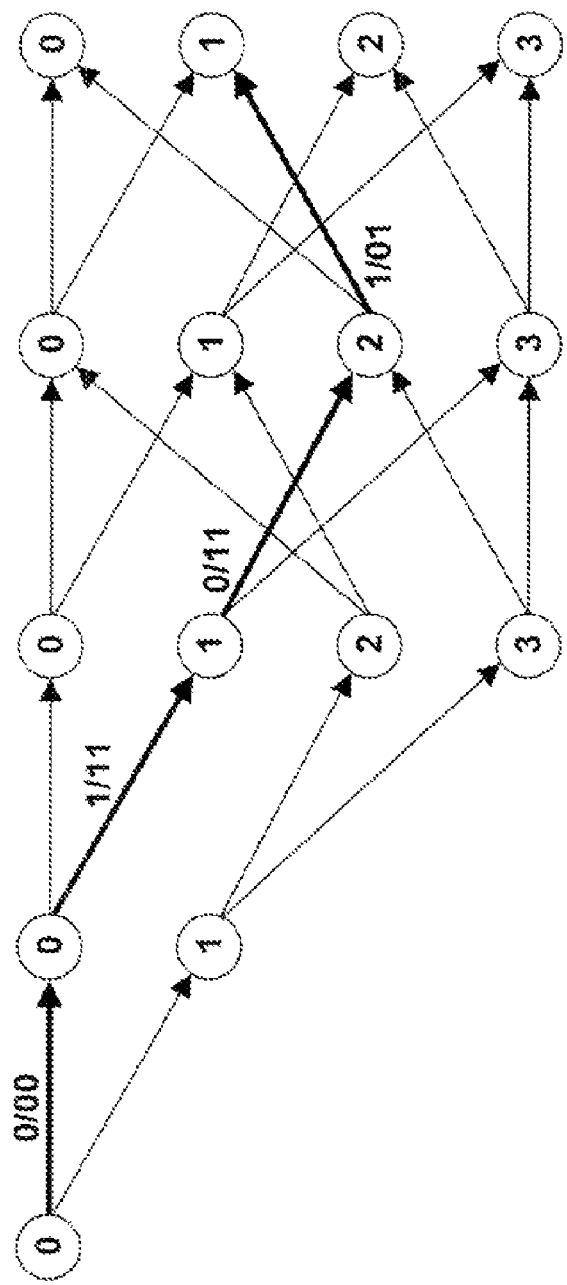
FIG. 3B is an illustrative diagram of an exemplary encoding path through the trellis diagram of FIG. 3A.

Trellis-based encoding and decoding are based on a trellis diagram. One example of a trellis diagram for a trellis-based encoder is shown in FIG. 3A. The illustrated trellis diagram includes four states, with state zero being the initial state. Each stage includes two branches exiting the state, and, after the second stage, each stage includes two branches entering the state. Each branch is associated with user information and parity information. In the illustrated embodiment, the user information is a single bit, and the parity information includes two bits. This is shown by the labels "u/pp" next to each branch, where u designates the user bit associated with the branch and pp designates the parity bits generated by choosing the branch. Encoding is initiated by starting at the initial state. From there, branches that correspond to the user information to be encoded are chosen, and the parity information corresponding to the chosen branches are output by the trellis-based encoder. FIG. 3B shows an example of an encoding path through the trellis diagram of FIG. 3A. In the illustrated example, the branch selections in the encoding path correspond to the four-bit user information "0101," as shown by the user bit portions of the branch labels. The parity information produced by this encoding path is "00111101," as shown by the parity bit portions of the branch labels.

The illustrated trellis diagrams of FIGS. 3A-3B are exemplary, and it is contemplated that the present invention applies to other trellis diagrams. Those skilled in the art will recognize that a trellis diagram may have more or less than four states, and each state may have more than two branches exiting and/or entering the state. Additionally, in connection with trellis-based encoding, each branch may be associated with more than one user bit, or more than two parity bits. In systematic encoders, one or more of the parity bits may be the same as the user bits, by definition. Additionally, the illustrated association of user and parity bits to particular branches is also exemplary. From this point on, for ease of explanation, the trellis structure of FIG. 3A will be used in explaining trellis-based encoding. However, the features mentioned herein, as well as other features of trellis-based codes not expressly mentioned herein, may vary depending upon the particular trellis-based code that is used. It is contemplated that the present invention also applies to such variations.

Aspects of Viterbi detection/decoding will now be described with reference to FIGS. 4 and 5. As described above in connection with FIG. 1A, maximum likelihood (Viterbi) detector 124 may operate based on the same trellis diagram as that of ISI channel 120. Also, as described above in connection with FIG. 1B, Viterbi maximum likelihood (Viterbi) decoder 116 operates based on the same trellis diagram as that of the trellis-based encoder 104. In both of the illustrated systems of FIGS. 1A and 1B, detection/decoding operate based on the same concept of computing metrics for each branch of the trellis based on the received signals/bits, and then identifying the path through the trellis that has the lowest cumulative metric. From this point on, the cumulative metric of a path will be referred to herein as a "path metric." Additionally, the path that has the lowest path metric will be referred to as the "winning path," and the trellis state at the end of the winning path will be referred to as the "winning state." All paths other than the winning path will be referred to as "losing paths."

Branch metrics may be computed in different ways. For example, in FIG. 1A, Viterbi detector 124 may compute branch metrics based on a modulator signal set (also called a "constellation") and based on a graphical representation of the signal set in a coordinate system. Using such a coordinate system, Viterbi detector 124 may compute the branch metrics based on the Euclidean distance between an output signal of ISI channel 120 and the output signals associated with branches of the trellis. In FIG. 1B, Viterbi decoder 116 may compute branch metrics based on Hamming distance between detected parity bits 114 and the parity bits associated with branches of the trellis. In some ISI channels, branch metric computation may be quite complex because the channels may be nonlinear and may involve data-dependent noise correlation, which requires nonlinear branch metric computation. In this situation, noise variance may not be the same for all trellis branches, so conventional methods based on linear matched filters for evaluating branch metrics may not be accurate. Therefore, for some ISI channels, noise variance may depend on particular trellis branches, and different filters may need to be used for different trellis branches. It is anticipated that the present invention applies in these cases as well.

Figure 4:
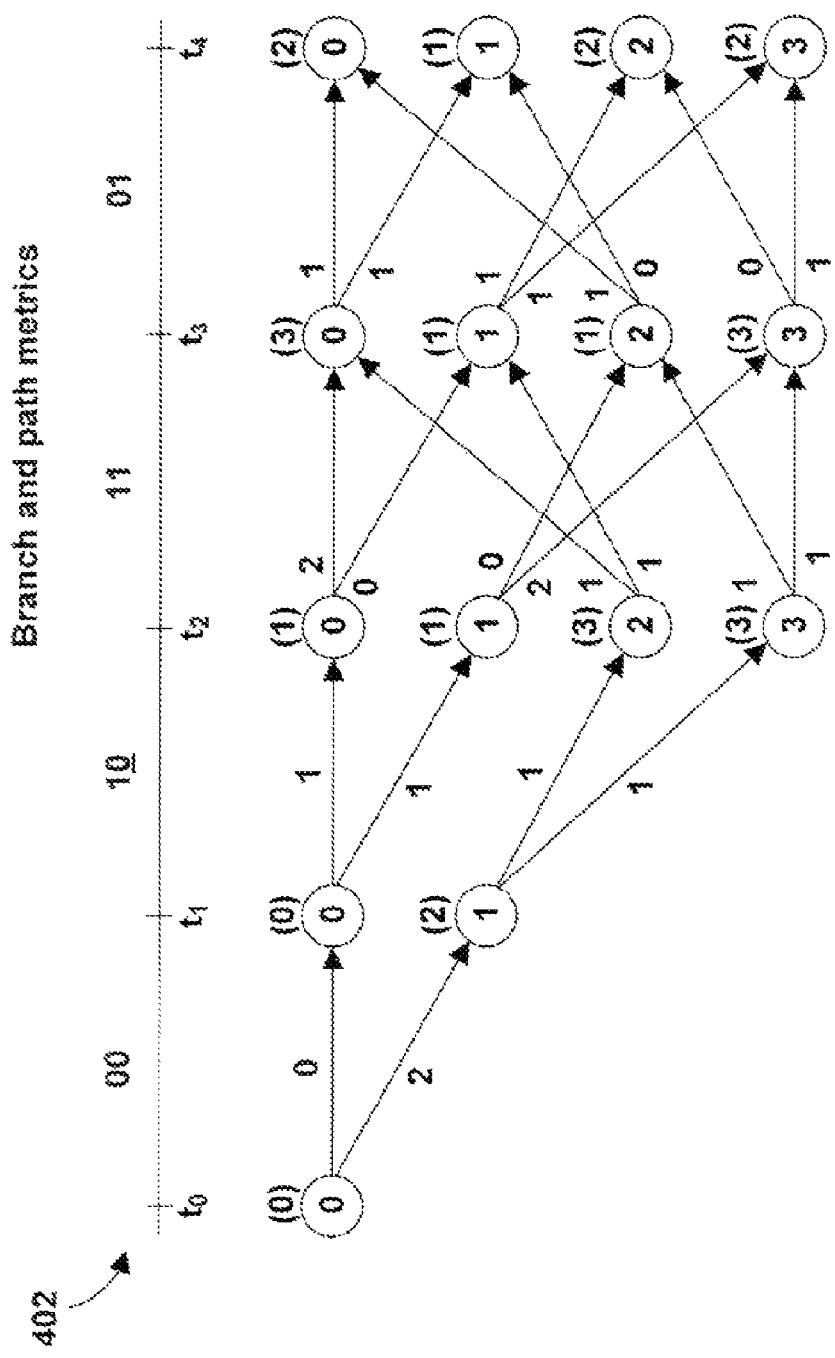
FIG. 4 is an illustrative diagram of exemplary decoding operation based on the trellis diagram of FIG. 3A.
Figure 5:
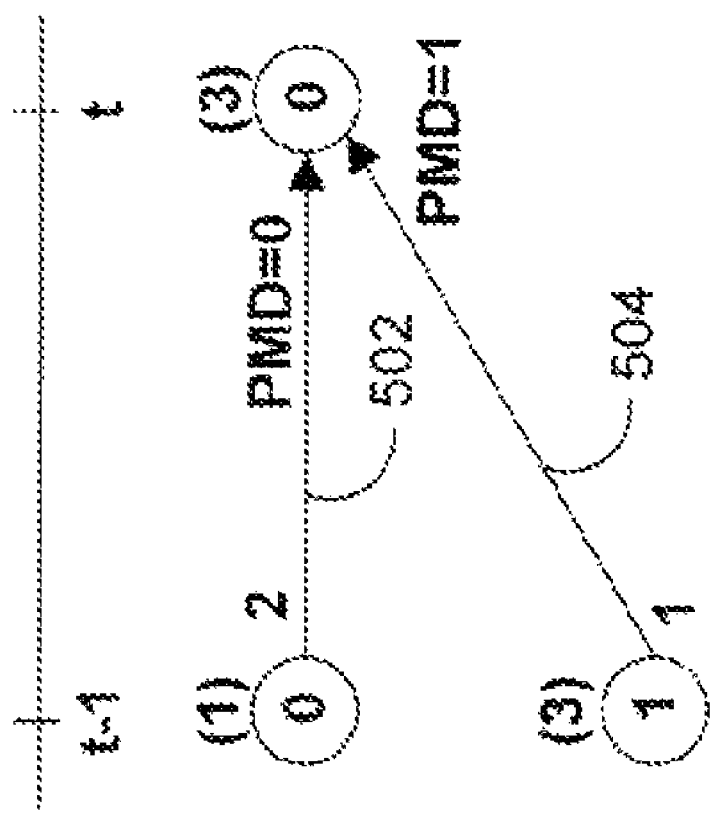
FIG. 5 is an illustrative diagram of path metric differences associated with branches of a trellis diagram.

Referring now to FIG. 4, there is shown one example of detected information 402 that includes a bit error. In the example, detected information 402 is "001 $\underline{0}$1101," which differs, in the fourth bit, from the parity information "001 $\underline{1}$1101" from the encoding path of FIG. 3B. However, as the following will show, the Viterbi decoder will be able to correct this error.

The detector of FIG. 4 uses the well-known Viterbi (i.e., maximum-likelihood) algorithm to recover the user information. As described above, the decoder chooses the trellis path that most likely occurred based on the potentially erroneous detected information 402. The sequence-detecting nature of the decoding gives the Viterbi decoder an ability to correct errors. In particular, if a small portion of detected information 402 is erroneous (e.g., only bit four), the decoder may still produce as the most likely path the original path that occurred during encoding.

The decoder makes the maximum-likelihood decision based on metrics that are computed and associated with the trellis branches. These metrics are shown for each branch of FIG. 4. In the illustrated embodiment of FIG. 4, the metric that is associated with a branch is computed as the Hamming distance between the parity bits associated with the branch and the detected bits associated with the trellis stage containing the branch. However, any appropriate branch computation method or algorithm may be used without departing from the spirit of the invention.

Additionally, each state keeps track of a path metric for the lowest-metric path leading to that state. This lowest-metric path to a particular state will be referred to herein as the winning path to that state. The initial state has a path metric of zero. After the initial stage, the path metric for each path may be computed as the sum of the path metric to the previous state in the path and the branch metric for the current branch in the path. For example, taking the top branch from the initial state in FIG. 4, the zero path metric plus the zero branch metric results in zero path metric for state zero at $t_1$. Taking the bottom branch from the initial state, the zero path metric plus the branch metric of two results in a path metric of two for state one at $t_1$. At any trellis stage t, the state that has the lowest cumulative metric is considered to be the most-likely state (or "winning state") for that stage. Therefore, at time $t_1$, it may be seen that state zero is the winning state. Performing the same computations at time $t_2$, $t_3$, and $t_4$, the trellis may determine the path metric for each path in the trellis and select the path with the lowest path metric to determine the most-likely or winning path.

The branch with the lowest path metric entering each state is referred to as the winning branch. Other branches entering the state that are not the winning branch are the losing branches.

Referring again to FIG. 4, the computations for time $t_3$ result in a tie between state one and state two for the lowest path metric. Therefore, at time t3, either state one or state two may be the winning state at time $t_3$. The computations for time $t_4$ result in state one alone having the lowest path metric. Therefore, at time $t_4$, state one is the winning state. To determine the path through the trellis that results in the winning state at time $t_4$, we may traverse the trellis backwards from state one at time $t_4$, each time choosing the winning branch, i.e., the branch that leads to smaller and smaller path metrics, until the initial state is reached. It may be seen that performing this backward traversal will result in the same path through the trellis as the encoding path of FIG. 3B. Accordingly, the decoder was able to correct an error in the detected data 402 and correctly identify the encoding path. The user information (102, FIG. 1) may be recovered by taking the user bits associated with the branches in the winning path in order from the initial state to the winning state.

In some embodiments, the present invention may compute and store "path metric differences" (PMD). As used herein, the PMD of a branch is defined as the difference between the path metric of that branch and the path metric of a winning branch to the winning state. This concept may be seen more readily with reference to the example in FIG. 5, which shows a portion of an exemplary trellis occurring between a time t−1 and a time t. In the illustration, at time t−1, state zero has a path metric of one and state two has a path metric of three. Branch 502 from state zero at time t−1 to state zero at time t has a branch metric of two and corresponds to a path metric of 1+2=3. Branch 504 from state two at time t−1 to state zero at time t has a branch metric of one and corresponds to a path metric of 3+1=4. Branch 502 has the smaller path metric and is, therefore, the winning branch. Branch 504 is the losing branch. The PMD for the losing branch is equal to the difference between the path metric for the losing branch (i.e., 4) and the path metric for the winning branch (i.e., 3). In the example of FIG. 5, the PMD for branch 504 is 4−3=1. By definition, the PMD for winning branch 502 is zero. As illustrated by the example of FIG. 5, PMD is computed on a state by state basis for all of the branches entering a particular state. A winning branch entering a particular state has a PMD of zero, and a losing branch entering that state has a PMD that is the difference between the path metric for that losing branch and the path metric for the winning branch.

Returning now to FIG. 4, although the decoding operation in FIG. 4 resulted in identifying the correct path, Viterbi decoding may, in some situations, produce an incorrect path. In this case, it may be helpful to identify alternate paths and their likelihoods of occurring.

Figures 6A, 6B:
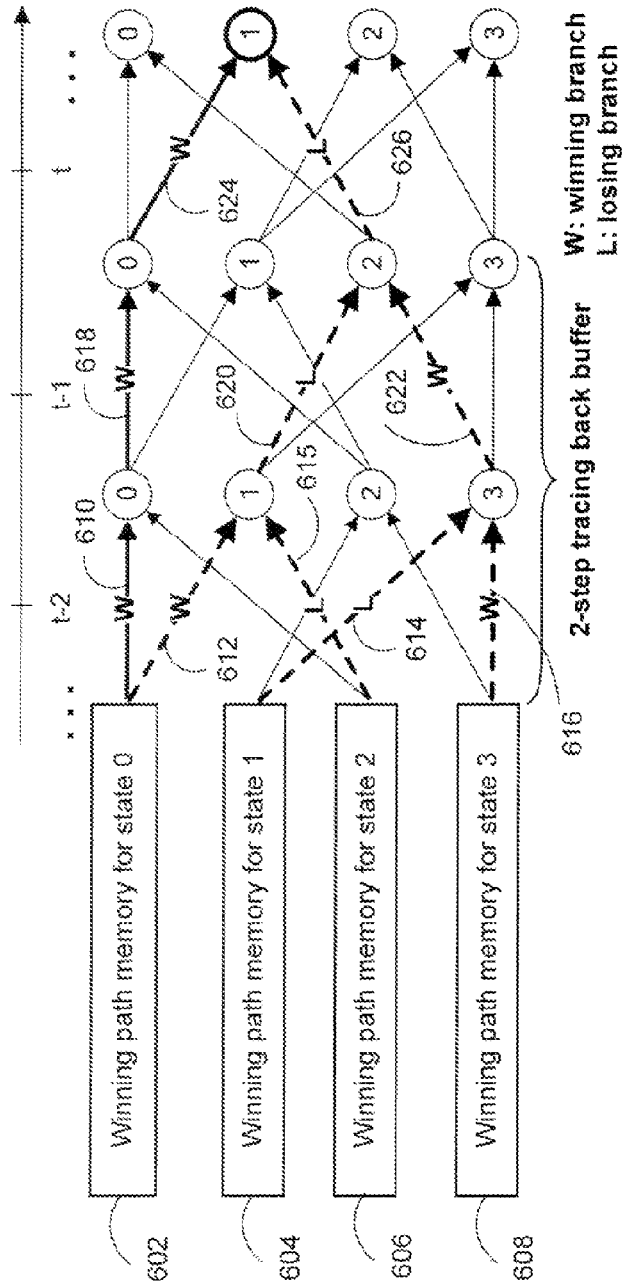
FIG. 6A is an illustrative diagram of exemplary alternate paths resulting from tracing back through a portion of a trellis.
FIG. 6B illustrates exemplary data that may be associated with the alternate paths in FIG. 6A.

In some embodiments, an alternate path may be identified by starting at the winning state and then tracing branches back through the trellis. FIG. 6A shows an illustrative four-state trace back trellis. The trace-back depth limits the number of trace-back stages, and in some cases, the number of alternate paths. In general, for a trace back depth of m, the number of trace back stages is m+1, and the number of alternate paths is $2^m$. For example, FIG. 6A has a two-depth tracing buffer and, therefore, includes three trace-back stages. FIG. 6A also includes winning path memories 602-608 for storing winning paths to states zero to three, respectively in the non-trace back portion the trellis. In some embodiments, information in memories 602-608 may be dynamically updated each time the boundary stage advances one trellis stage. The winning path of the trellis and each alternate path may have a non-trace back portion that corresponds to one of the stored paths. Therefore, decoded information corresponding to the winning paths to states zero to three and any alternate paths may be retrieved directly or indirectly from memories 602-608.

In the trellis of FIG. 6A, state one is the winning state and the winning path includes branches 610, 618, and 624. In this illustrative embodiment, at the first trace back branch selection, rather than choosing winning branch 624, losing branch 626 is chosen. From there, either winning branches or losing branches may be selected to identify different alternate paths. In some embodiments, PMD values may be used to determine which branches to choose during trace back. The trace back of FIG. 6A identifies four alternate paths: alternate path 1 (which includes branches 612, 620, and 626), alternate path 2 (which includes branches 615, 620, and 626), alternate path 3 (which includes branches 614, 622, and 626), and alternate path 4 (which includes branches 616, 622, and 626). In this embodiment, alternate paths are identified by first selecting a losing branch. However, alternate paths may also be identified by first selecting the winning branch and then choosing winning or losing branches after that. FIG. 6B shows the path metrics and bit sequences for the alternate paths of FIG. 6A.

In some embodiments, the user bits for the winning path may be compared to the user bits for the alternate paths to generate error patterns. For example, suppose the winning path corresponds to user bits "0011011" and an alternate path corresponds to user bits "0111101." These user bit sequences may be compared to form an error pattern in which locations of the bit differences are shown by a "1" symbol, and the locations having the same bits are shown by a "0" symbol. Accordingly, for the example above, the error pattern is "0100110." A straightforward XOR operation may be used to generate the error patterns.

Alternate paths and their corresponding error patterns may be associated with likelihood metrics. In general, the likelihood metric associated with a bit location in an error pattern is initialized using an error metric (e.g., the path metric difference of a converging path) at the location. After initialization, the likelihood metric is updated every time a new error event indicates an error in that bit location (i.e., the error pattern has a bit mask of "1" in the location) by choosing the smaller of its current value and the error event metric of the new error event. However, due to hardware limitations in buffer size, a new error event may be used to update only a finite range of past errors within an error event update window. In general, an error event update window value of m may allow an error event to update error patterns corresponding to the most recent m decoded bits. The tail or residue of the error event that falls outside (or prior to) the error event update window is ignored.

In known computations of likelihood metrics, an error event for an alternate path may be used to update the likelihood metrics of bit locations in an error pattern only if the alternate path converges into the same winning state as the winning path for the decoded bits. Error metrics associated with alternate paths that do not converge into the winning state are ignored. However, by doing so, these known likelihood metric computations may ignore sequences containing defective bits that are more likely to be mis-detected due to signal distortions introduced by the defects, and, as a result, take longer to converge than counterpart signals that may not be otherwise affected by such defects. Therefore, known likelihood metric computations may generate likelihood metrics that overestimate the reliability of the detection, especially in situations where the received signals are defective.

In accordance with the principles of the present invention, an improved mechanism for computing likelihood metrics that uses some of the metrics ignored by known likelihood metric computations may be used to update likelihood metrics in the trellis. In some embodiments, likelihood metrics for error patterns may be generated using at least two metrics. In particular, bits in each error pattern may be separated into two categories: a first subset of bits that fall within an error update event window and a second subset of bits that fall outside of the error event update window, with the more recent bits in the error pattern sequence falling within the error update window. The error event update window may determined using any suitable means, and may be a predetermined, hard-wired value or a dynamically determined value.

In accordance with the principles of the present invention, likelihood metrics for the first subset of bit locations in the error patterns may be updated based on a first metric, and likelihood metrics for the second subset of bit locations in the error patterns may be updated based on a second metric. In sore embodiments, the first metric may be based on path metrics (e.g., the path metric difference) associated an alternate trace back path in the trellis.

In some embodiments, the second metric may be a predetermined value such as, zero or some other small metric. Alternatively, the second metric may be based on a second alternate path that does not converge into the same winning state as the decoded sequence in the particular error event update window. In these embodiments, the second metric may be the path metric difference between the second alternate path and the winning path corresponding to the decoded sequence. In particular, the second alternate path may be selected based on path metrics for paths in the trellis. For example, the second alternate path may be the path with the second lowest path metric, and therefore, the second best path, in the trellis. In some embodiments, the likelihood metric for a bit location in the second subset of bit locations may be updated only if the winning path decision for that bit location differs from the second alternate path decision for the same bit location. Detailed illustrative embodiments of the present invention are explained with reference to FIGS. 7-10.

Figure 7:
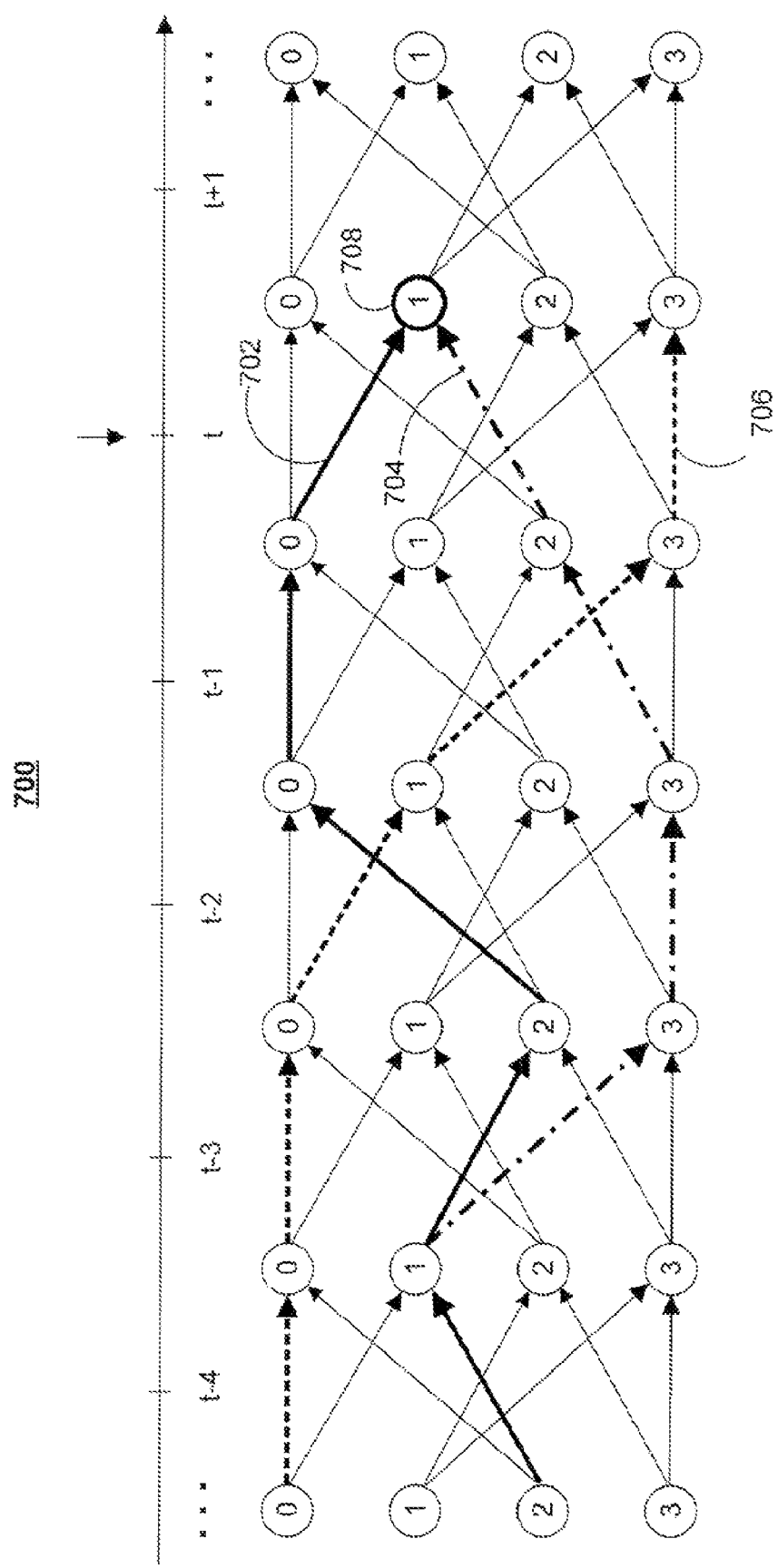
FIG. 7 is an illustrative diagram of exemplary alternate paths in accordance with some embodiments of the invention.

FIG. 7 shows illustrative four-state trellis 700, which includes winning path 702 entering winning state 708 at time t. Trellis 700 also includes track back path 704 converging into winning state 708 at time t, and alternate path 706 which does not converge into the winning state at time t. For illustrative purposes, it is assumed that the error event update window for trellis 700 is four. However, it is understood that any error event update window may be used.

As described above, in known computations of likelihood metrics, error event metrics (e.g., PMD) for trace back path 704 may be used to update the likelihood metrics associated with bit error locations at time t, t−1, t−2, and t−3. However, due to the finite error event length (which is four, in this example), the PMD of alternate path 704 at time t is not used to update likelihood metrics for errors at bit locations t−4 or earlier. In addition, the error metric associated with non-converging alternate path 706 is ignored for likelihood metric updates because alternate path 706 does not converge into winning state 708 at time t. In trellis 700, it should be noted that if alternate path 706 converges into the winning state at time t+1, its PMD may be used to update likelihood metrics at t−2, t−1, t, and t+1. However, in known likelihood metric computations, the error event associated with alternate path 706 will not be used to update likelihood metrics at time t−3 even if it converges at t+1. Therefore, it can be seen that, using known likelihood metric computations, trellis 700 may ignore error metrics associated with certain potential winning paths if those paths do not converge into the winning state within a particular error event update window. Although these metrics may be ignored for non-defective bits with negligible impact on the reliability of the resulting likelihood metrics, this is not the case for defective bits where the defects themselves may induce longer error events in affected sequences.

Therefore, in accordance with the principles of the invention, a modified likelihood computation may be used to update likelihood metrics in the trellis with some of the error events or metrics that are ignored by known likelihood metric computation mechanisms. In particular, referring to the example described above in relation to illustrative trellis 700 (FIG. 7), in some embodiments, the PMD associated with converging alternate path 704 may be used to update likelihood metrics at bit locations in the error event update window (i.e., bit locations at times t, t−1, t−2, and t−3). In some embodiments of the invention, in a particular error event update window, likelihood metrics for at least some bit locations in the error pattern may be updated based on an alternate metric that is not associated with an alternate path that converges into the winning state for that particular error event update window. For example, at time t, an alternate metric may be used to update likelihood metrics at bit locations prior to time t−3 (i.e., for bit locations that fall outside the error update window). In accordance with the principles of the present invention, for an error event length m, the alternate metric may generally be used to update bit locations from times t−n to t−m, where n>m. Therefore, for trellis 700, where m=4, the alternate metric may be used to update likelihood metrics for bit locations at times t−4, t−5, t−6, and t−7.

The alternate metric used may depend on various factors, including, but not limited to, the characteristics of the channel. For example, in some embodiments, the alternate metric may be determined based on the severity of certain defects, such as amplitude defects in the channel. In some embodiments, the alternate metric may be the path metric difference between alternate non-converging path 706 and winning path 702. In these embodiments, alternate non-converging path 706 may be the path having the second lowest path metric, and thus, the second best path, in the trellis. In yet other embodiments, the alternate metric may be a predetermined value such as zero or some other small metric. Regardless of how the alternate metric is determined, in some embodiments, the alternate metric may be used to update the likelihood metric for a bit location outside of the error update window only if the winning path decision for that bit location differs from the non-converging alternate path decision for the same bit location. Alternatively, the likelihood metric for a bit location may be updated if the decisions in path memory for that bit location differ. In the example in FIG. 700, at time t, the first set of alternate paths all converge to state 1 (labeled 708), and their associated path metrics are not used to update the likelihood metric for bits at time t−4. However, suppose that path 706 entering state 3 at time t is the second best path at time t, then tracing back through path 706 shows that the bit value at time t−4 should be "0." In this instance, this value is different from that predicted by the converging paths, which all predict that the bit value at time t−4 should be "1." Therefore, in accordance with aspects of the invention, the likelihood metric for t−4 may be updated using either the path metric difference between state 3 and state 1 at time t, or some predetermined value.

Figure 8:
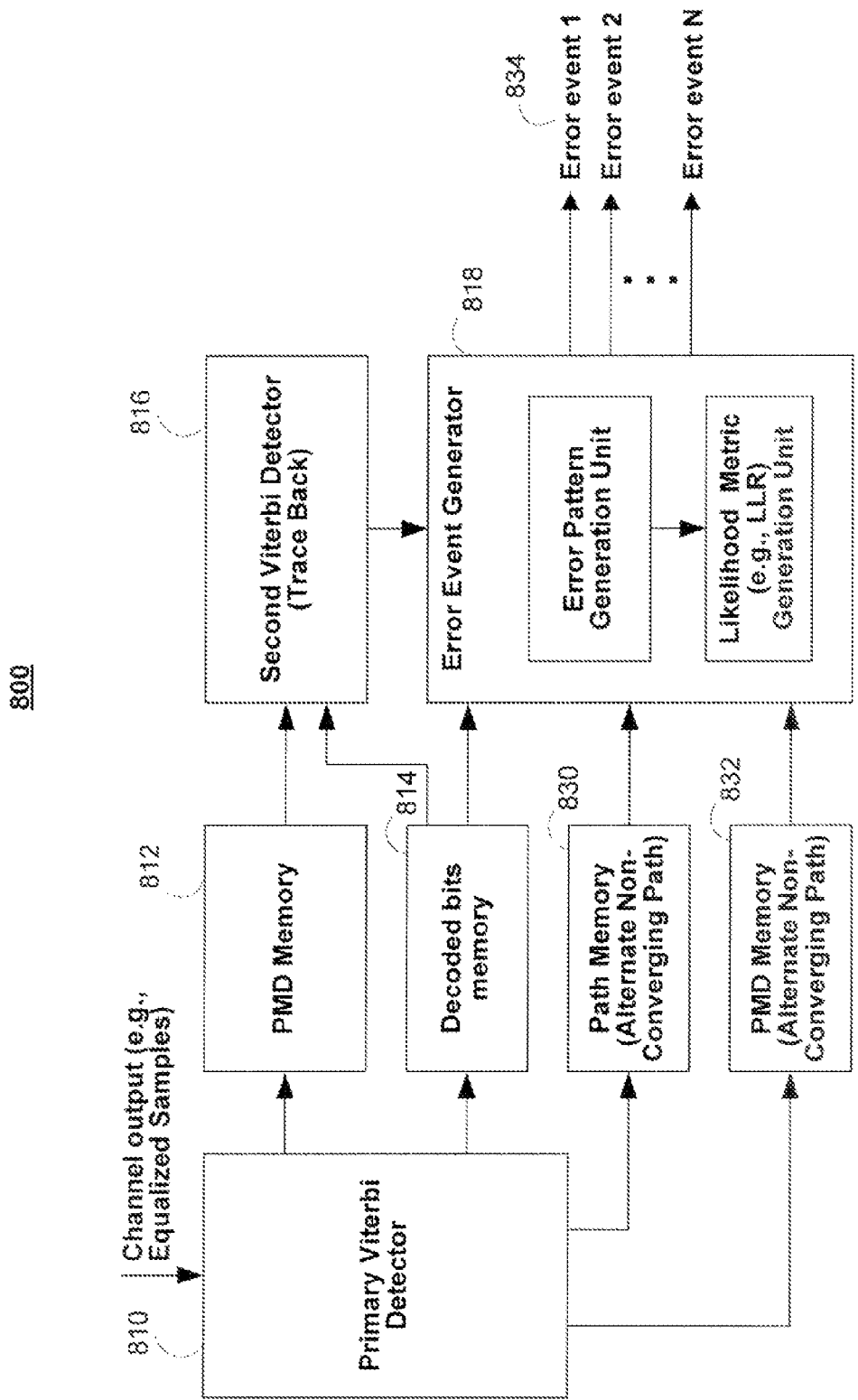
FIG. 8 is an illustrative block diagram an exemplary error event generating system in accordance with some embodiments of the invention.

In some embodiments of the invention, alternate paths, error patterns, alternate metrics, and likelihood metrics may be computed using illustrative system 800 shown in FIG. 8. System 800 includes primary Viterbi block 810 and second Viterbi block 816. Primary Viterbi block 810 may include PMD computation unit (not shown) for computing path metric differences for branches in the trace back portion of the trellis. Primary Viterbi detector 810 may also include add-compare-select (ACS) unit (not shown) which may accumulate path and branch metrics along branches in the trellis path, compare path metrics for the branches, and select branches to determine the global winning path and thus the decoded information. The path metric differences may be stored in a path metric difference memory 812, and the decoded bits corresponding to the winning path may be stored in a decoded bits memory 814.

In addition to identifying a winning state, primary Viterbi detector 810 may also identify an alternate path that does not converge into the winning state at the current trellis stage of interest. The alternate non-converging path may be identified based on path metrics. For example, the alternate non-converging path may be the path with the second best/lowest path metric in the trellis. The digital sequence for the alternate non-converging path may be stored in path memory 830 and the corresponding path metric difference for the non-converging alternate path may be stored in PMD memory 832. In some embodiments, path memory 830 and PMD memory 832 may be FIFO buffers. In some embodiments, path memory 830 and PMD memory 832 may be the same physical memory block or the same buffer. In some embodiments, PMD memory 812, decoded bits memory 814, alternate non-converging path memory 830, and alternate non-converging path PMD memory 832 may be combined into one or more memory blocks.

Based on the winning state in each trellis stage identified by primary Viterbi block 810, second Viterbi block 816 may perform trace back to identify alternate paths that converge to the same winning state as decoded bits 814. Second Viterbi block 816 may generate alternate paths by starting at the winning state in the trellis, and tracing back through the trellis by first selecting a losing branch. The number of alternate paths identified by second Viterbi block 816 may be restricted by the trace back depth or other predetermined parameter such as, a predetermined maximum number of alternate paths.

Using alternate paths identified by second Viterbi block 816, error event generator 818 may generate error patterns 834 based on the trace back portions of the alternate paths, the non-trace back portions of the alternate paths stored in path memory (not shown) of second Viterbi block 816, and the decoded bits stored in decoded bits memory 814. Error event generator 818 may also generate an error pattern for alternate non-converging path 830. In some embodiments, error event generator 818 may compute likelihood metrics for the generated error patterns 834 using the PMD values stored in PMD memory 812, and alternate non-converging path information in memories 830 and 832, as described above herein. Furthermore, in some embodiments, error event generator 818 may include memory (not shown) for storing and maintaining error patterns with respect to the decoded bits of the winning path. The error patterns and likelihood metrics together are also referred to herein as "error events."

In some embodiments, second Viterbi block 816, in addition to identifying alternate paths, may also eliminate certain alternate paths based on various elimination criteria. For example, in some embodiments, second Viterbi 816 may include a metric threshold and may eliminate alternate paths whose likelihood metrics exceed the threshold. In some embodiment, second Viterbi 816 may include a set of predetermined error patterns of interest and may keep only those alternate paths that produce error patterns identical or similar to the predetermined error patterns of interest. In some embodiments, second Viterbi 816 may eliminate alternate paths that include more than a predetermined number of losing branches. Other elimination criteria are possible, and it is contemplated that other elimination criteria may be used.

Figure 9:
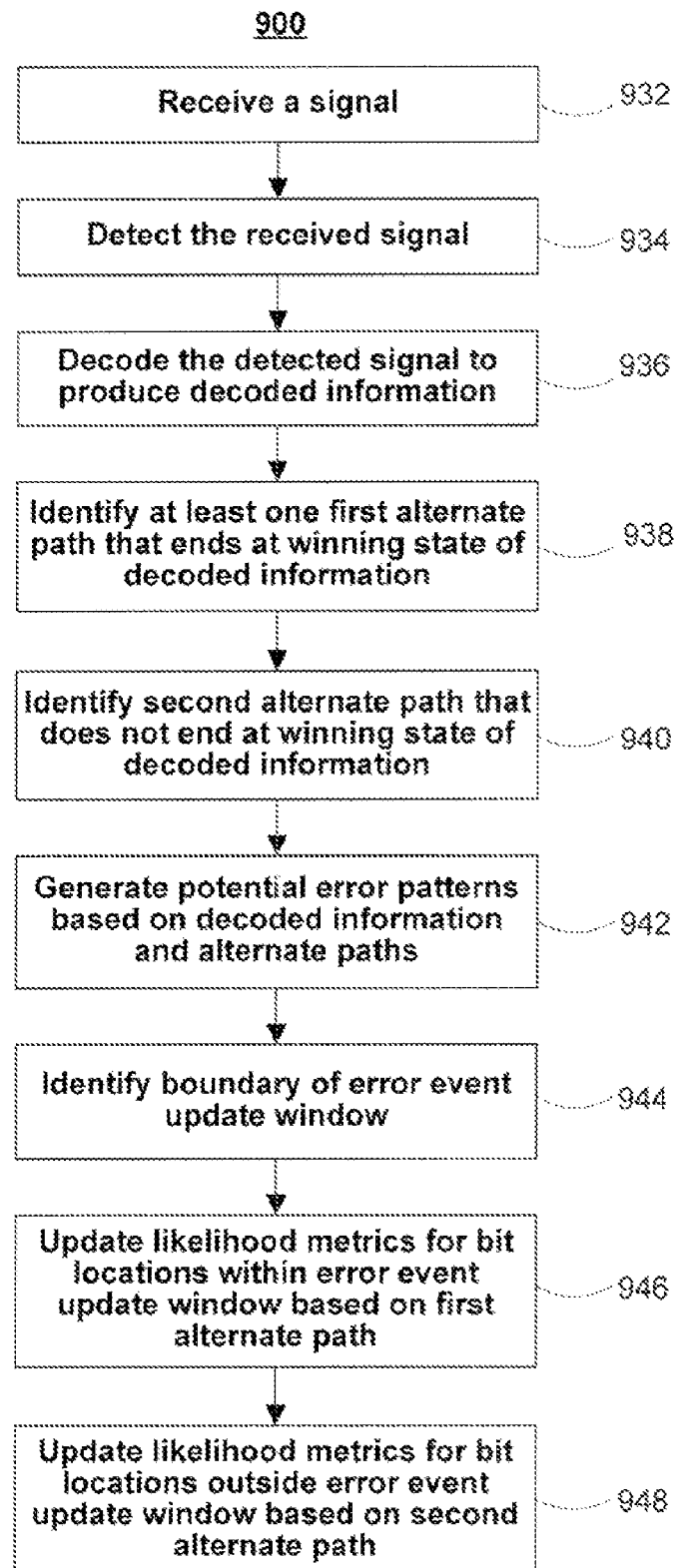
FIG. 9 is an illustrative flow diagram of a process for generating likelihood metrics in accordance with some embodiments of the invention.

Referring now to FIG. 9, illustrative flow diagram 900 shows steps that an error event generation unit (e.g., error event generation unit 818 of FIG. 8) may use to compute a set of likelihood metrics for the error patterns. At step 932, a signal may be received. The signal may have any suitable properties. For example, the signal may be a return-to-zero signal. The signal may have binary levels (e.g., +a and −a) or the signal may have more levels (e.g., 4, 16, 32 levels, etc.). The signal may be received directly or indirectly from a channel (e.g., a magnetic recording channel). Alternatively, the signal may be obtained from another component in a Viterbi detector, such as an FIR equalizer or any suitable filter. In some embodiments, such as when iterative decoding is used, the signal may be received from another detector, which may or may not be a Viterbi detector. In still other embodiments, multiple signals from various sources may be received. For example, a signal from an FIR equalizer may be received and a signal from another signal from a Viterbi detector may also be received. In some embodiments, the received signal may be user information that was previously encoded based on a trellis.

After the signal is received at step 932, the signal may be detected at step 934 to produce detected information. The signal may be detected using any appropriate detection mechanism. In some embodiments, the signal may be detected using a maximum-likelihood Viterbi detector. The detected information may be decoded to provide decoded information at step 936. The decoded information may correspond to a winning path ending in a winning state in the trellis based on which the received signal may have been encoded.

After the detected signal is decoded at step 936, one or more first alternate paths that also end at the winning state of the trellis may be identified at step 938. The alternate paths may be identified by a second detector, based on the decoded information and path metric information determined by a first decoder at steps 934 and/or 936. In some embodiments, alternate paths may be identified by tracing back through the trellis from the winning state through a losing branch connected to the winning state.

At step 940, a second alternate path may be identified. The second alternate path may be the path with the second best/lowest path metric in the trellis. In some embodiments, the second alternate path ends in a state other than the winning state.

After the alternate paths are identified, potential error patterns may be generated at step 942. Any suitable error pattern generation unit, such as error generation unit 818 (FIG. 8) may be used. In some embodiments, an error pattern may be generated by a simple XOR function between corresponding bit positions in an alternate path and the winning path (or decoded information). Computed in this manner, a "1" in a bit position in an error pattern indicates an error in that bit position.

After error patterns are generated in step 942, likelihood metrics may be associated with each error patterns, indicating the likelihood of error in the error pattern. In general, the likelihood metric for a bit location may be initialized by the path metric difference at that location. After initialization, the likelihood metric is updated for each new error event having an error at that location (e.g., a mask bit of "1" at that location) by selecting the smaller of the current likelihood metric and the error event metric for the new error event. Updates to likelihood metrics may be limited by an error event length, which determines the error event update window. For example, if the error event update window is m, an error event metric at time t may only update up to m likelihood metrics for bit locations from t−m+1 to t. Bit locations that fall within this range are considered to be within the error update window, and bit locations that fall outside this window are considered to be outside the error update window. To associate each error pattern with a likelihood metric, in accordance with the principles of the invention, the boundary of the error update window may be identified in step 944.

At step 946, likelihood metrics associated with bit locations that are inside the error update window may be updated based on the path metric difference for one of the first alternate paths. At step 948, likelihood metrics for bit locations that fall outside the error update window may be updated based on the path metric difference for the second alternate path. In accordance with the principles of some embodiments of the invention, the path metric difference associated with the second alternate path at time t may be used to update likelihood metrics for bit locations from t−2m+1 to t−m. In some embodiments, a bit location outside the error window may be updated using the PMD for the second alternate path only if the second path decision for that bit location differs from the winning path decision for the same bit location.

In some embodiments, at step 948, instead of updating the likelihood metrics of bit locations outside the error update window based on the PMD of the second alternate path, a predetermined value of 0 or some small metric may be used. In these embodiments, the second alternate path may provide information on the bit locations to update.

In practice, one or more steps shown in illustrative process flow 900 may be combined with other steps, performed in any suitable order (including performing some steps in reverse order), performed in parallel (e.g., simultaneously or substantially simultaneously) or removed. For example, in some embodiments, such as when the received signal has already been decoded, steps 934 and 936 may be skipped.

Compared to known likelihood computation mechanisms that rely solely on metrics for converging paths, the modified likelihood metric computation in accordance with the present invention advantageously results in likelihood metrics with reduced magnitudes for defective bits, and thus, more accurately reflect the reliability of the detection. Furthermore, likelihood metrics obtained from the modified likelihood metric computation of the present invention for non-defective bits are substantially similar to those obtained from existing likelihood computation mechanisms.

The error events generated by error event generator 818 in system 800 (FIG. 8) and process 900 (FIG. 9) may be used for various applications. For example, some applications that may make use of error events include a soft Reed Solomon decoder or iterative decodable codes that use log-likelihood ratios of bits or codeword syndrome values.

Figure 10:
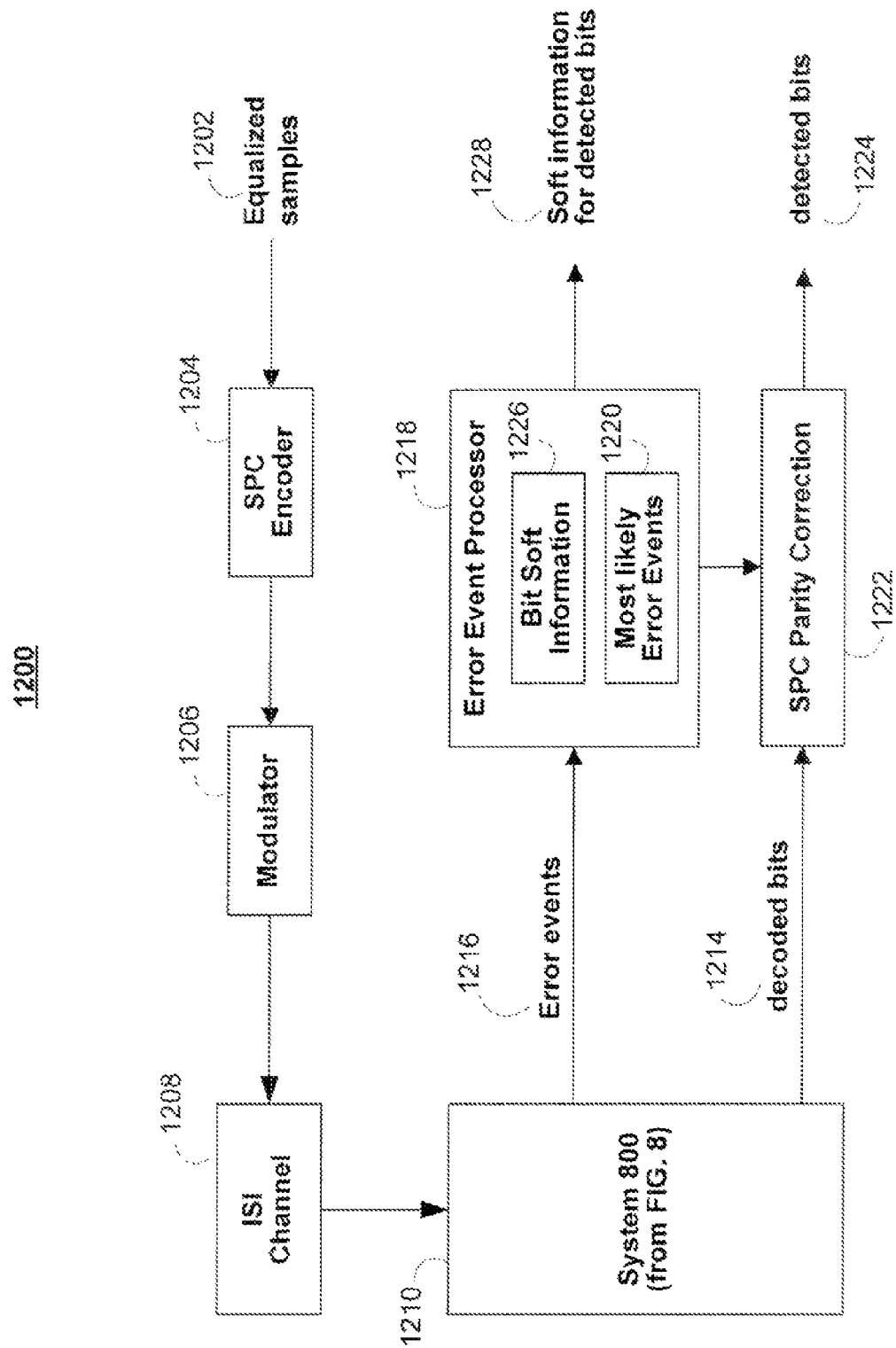
FIG. 10 is a block diagram of an exemplary system for using error events for SPC parity correction and soft information generation in accordance with some embodiments of the invention.

FIG. 10 shows illustrative communication and/or storage system that uses error events generated by a system such as for example, system 800 of FIG. 8 to perform error correction, in accordance with some embodiments of the invention. In the illustrated embodiment, the error correction is performed using a single parity check (SPC) code. This parity check code is separate from the parity information generated by the trellis-based encoder discussed above. This parity check code parity bits, when added to a code word, becomes a user bit for the convolutional encoder. On the encoding side, user bits 1202 are encoded by SPC encoder 1204. SPC encoder 1204 may operate based on a block length L, so that L user bits 1202 are encoded as a group. SPC encoder 1204 may generate a parity bit (not shown) and append the parity bit to the L user bits to form a code word of L+1 bits. The parity bit may be generated, for example, to cause the code word to have even parity error syndrome. The code word may be modulated by modulator 1206 and communicated to ISI channel 1208.

In some other embodiments, a multiple-bit parity syndrome may be used instead of a single-bit parity syndrome. For multiple-bit parity syndromes, instead of determining odd and even parity error syndromes, the syndrome values may be computed based on a parity check matrix and may have additional possible values. Further, two or more multiple-bit parity syndromes may be combined to form a combined multiple-bit parity syndrome. The combined multiple-bit parity syndrome may be more likely than any of the individual multiple-bit parity syndromes, i.e., combined multiple-bit parity syndrome may be associated with a smaller error event metric than any of the individual multiple-bit parity syndromes.

Illustrated system 1200 includes system 800 of FIG. 8. It is understood that system 800 may include additional components as needed for the application in system 1200. Error events 1216, including error patterns and likelihood metrics, generated by system 800, are provided to error event processor 1218. Error event processor 1218 identifies the most-likely error events 1220 based on the likelihood metrics. Using most-likely error events 1220, SPC parity correction circuit 1222 may correct potential errors in decoded bits 1214 to generate corrected bits 1224. Error event processor 1218 may include bit soft information block 1226, which generates soft reliability information 1228 indicating the reliability of corrected bits 1224.

SPC parity correction circuit 1222 may process code words of decoded bits 1214 to determine the parity error syndrome of the code words. For example, in some embodiments, each code word may be expected to have an even/zero parity error syndrome. If the parity error syndrome is not even (i.e., it is odd or one), SPC parity correction circuit 1222 may flip an odd number of bits in the code word to produce even parity error syndrome. In some embodiments, SPC parity correction circuit 1222 may determine which bits to flip based on the most-likely error events 1220 that have an odd parity. In other words, SPC parity correction circuit 1222 may select the subset of error events 1220 that have an odd parity error syndrome. The selected error patterns may be used to flip bits in the code word according to the error event, to produce an even parity error syndrome in the code word.

The location of the error event within the code word may be determined by the time index of the trellis where the error event is found. For example, an error event found at trellis index 5 has a code word location of 5. In each code word, there may be multiple candidate error events with the desired parity error syndrome. In some embodiments, the error event with the smallest error event metric may be selected and the other error events may be discarded. Thus, the parity correction is performed when all of the error events that may possibly overlap the code word are evaluated and their metrics compared (i.e., the parity correction is performed for each code word and not for each error event).

In accordance with one aspect of the invention, the parity error syndrome of the non-trace back portion of an error pattern (also called "error parity") may be maintained in a memory. This stored parity error syndrome may be used to more quickly compute the parity error syndrome of an error event. Each time the boundary stage advances one trellis stage, the stored parity error syndrome may be updated based on a new error pattern bit. However, the stored parity error syndrome may be reset to zero whenever one code word ends and another code word begins. For computing the parity of a cross-boundary error event corresponding to the previous code word, the stored error event syndrome for the previous code word is still needed after the trellis advances into a new code word boundary, thus two copies of the error event parity syndromes are needed in the memory, one for the previous code word, and one for the current code word. These two sets of parity syndrome bits record/track the contribution of the non-trace-back portions of the error events to the error event syndromes for the current code word and the error event syndromes for the previous code word. The role of these two sets of error event parity bits alternate as the trellis advances across code word boundaries.

In some embodiments, in connection with SPC parity correction, it may be possible for an error event to span more than one code word. In one embodiment, error patterns for more than one code word may be stored in a memory or storage to accommodate such situations. Because error events may overlap multiple code words, multiple error event parity computing processors and error event metric comparators for different code words may be required. For each code word, the most likely error event with the desired parity error syndrome value is found (i.e., the error event having the smallest metric).

In some embodiments, the error events may be defined on the detected bits instead of on the user bits. That is the primary Viterbi computes the winning path in order to detect the winning path sequence of coded bits. The difference between this winning path sequence of detected bits and the bits along alternative paths defines an error event.

In accordance with one aspect of the invention, for ISI channels, there is no encoder or decoder. In other words, the user bits are the same as the coded bits and there are no parity bits in the trellis. For a convolution code trellis used on an ISI channel, there may be three different variables for each trellis branch, trellis input (user bits), trellis output bits (parity bits or coded bits), and the transmitted ISI signal(s). Each branch may correspond to multiple inputs/outputs/signals.

Referring now to FIGS. 11A-11G, various exemplary implementations of the present invention are shown.

Figure 11A:
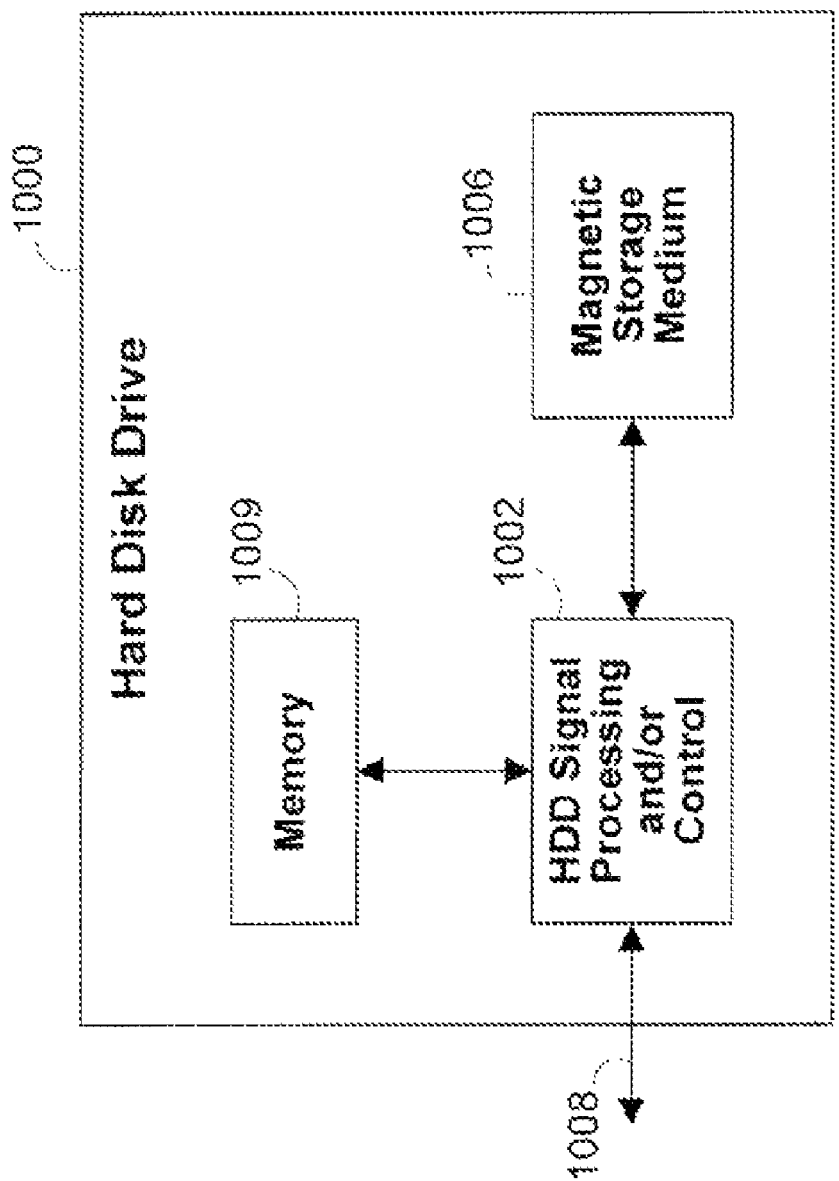
FIG. 11A is a block diagram of an exemplary hard disk drive that may employ the present invention.

Referring now to FIG. 11A, the present invention may be implemented in a hard disk drive 1000. The present invention may implement either or both signal processing and/or control circuits, which are generally identified in FIG. 11A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 11B:
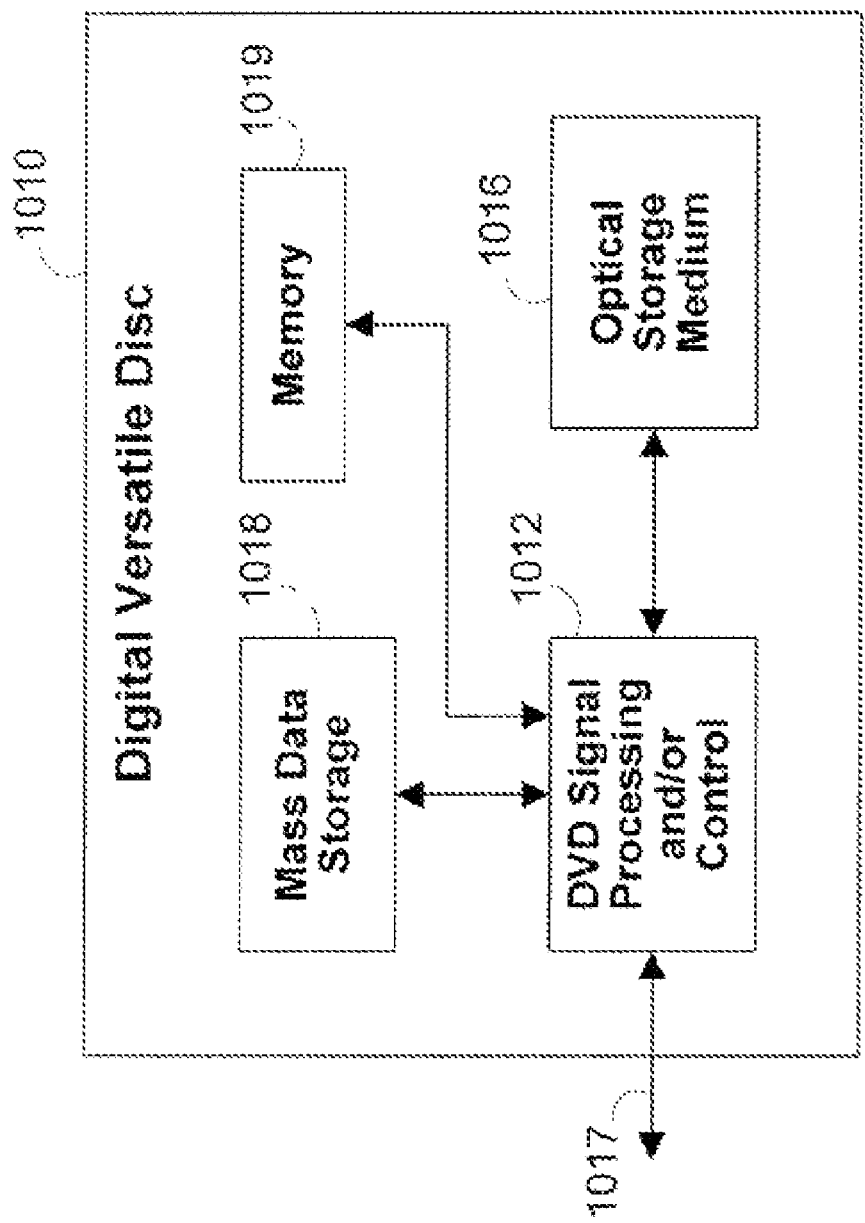
FIG. 11B is a block diagram of an exemplary digital versatile disc that may employ the present invention.

Referring now to FIG. 11B, the present invention may be implemented in a digital versatile disc (DVD) drive 1010. The present invention may implement either or both signal processing and/or control circuits, which are generally identified in FIG. 11B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 may also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 11A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 11C:
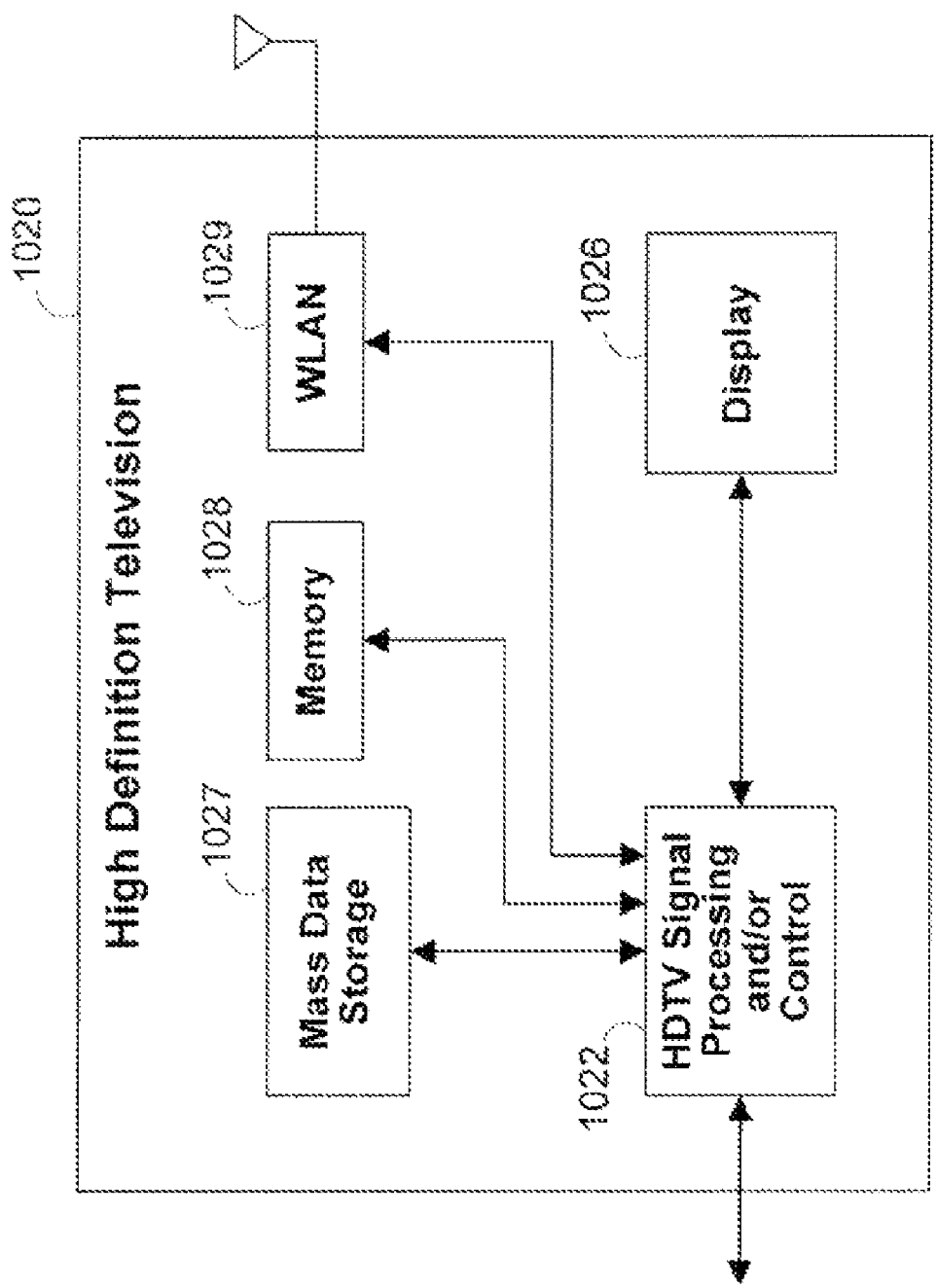
FIG. 11C is a block diagram of an exemplary high definition television that may employ the present invention.

Referring now to FIG. 11C, the present invention may be implemented in a high definition television (HDTV) 1020. The present invention may implement either or both signal processing and/or control circuits, which are generally identified in FIG. 11C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 11A and/or at least one DVD may have the configuration shown in FIG. 11B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 11D:
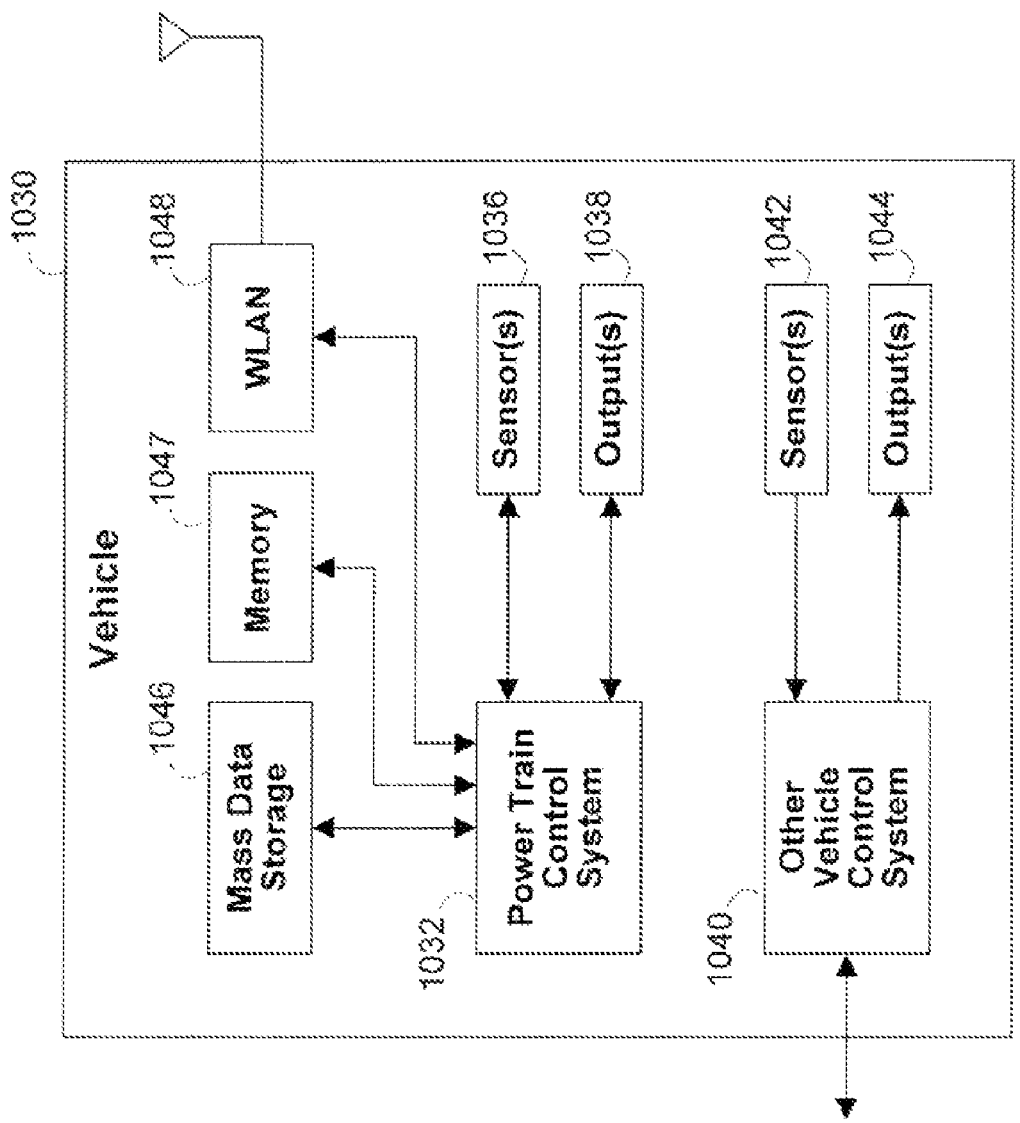
FIG. 11D is a block diagram of an exemplary vehicle that may employ the present invention.

Referring now to FIG. 11D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 11E:
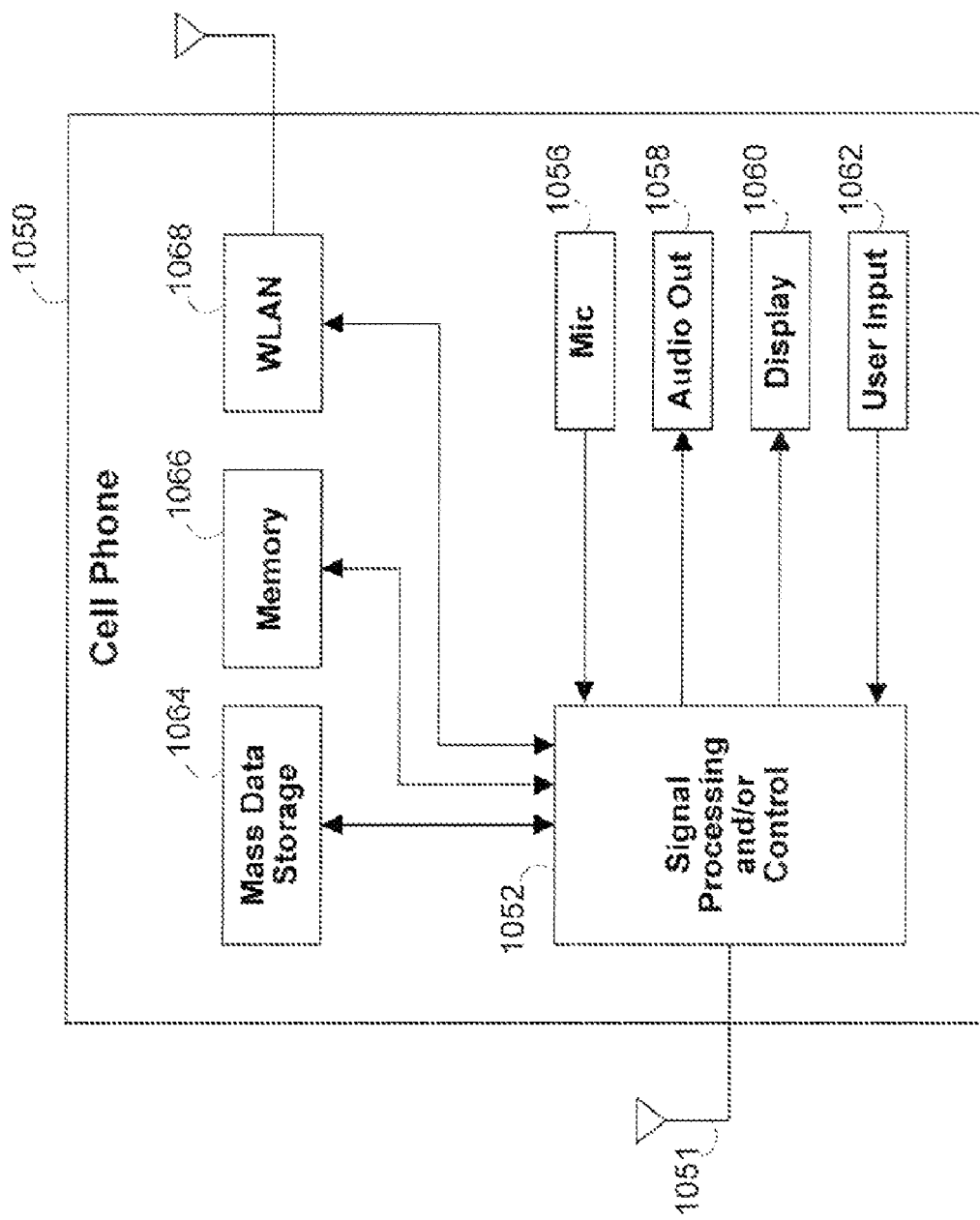
FIG. 11E is a block diagram of an exemplary cell phone that may employ the present invention.

Referring now to FIG. 11E, the present invention may be implemented in a cellular phone 1050 that may include a cellular antenna 1051. The present invention may implement either or both signal processing and/or control circuits, which are generally identified in FIG. 11E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 11F:
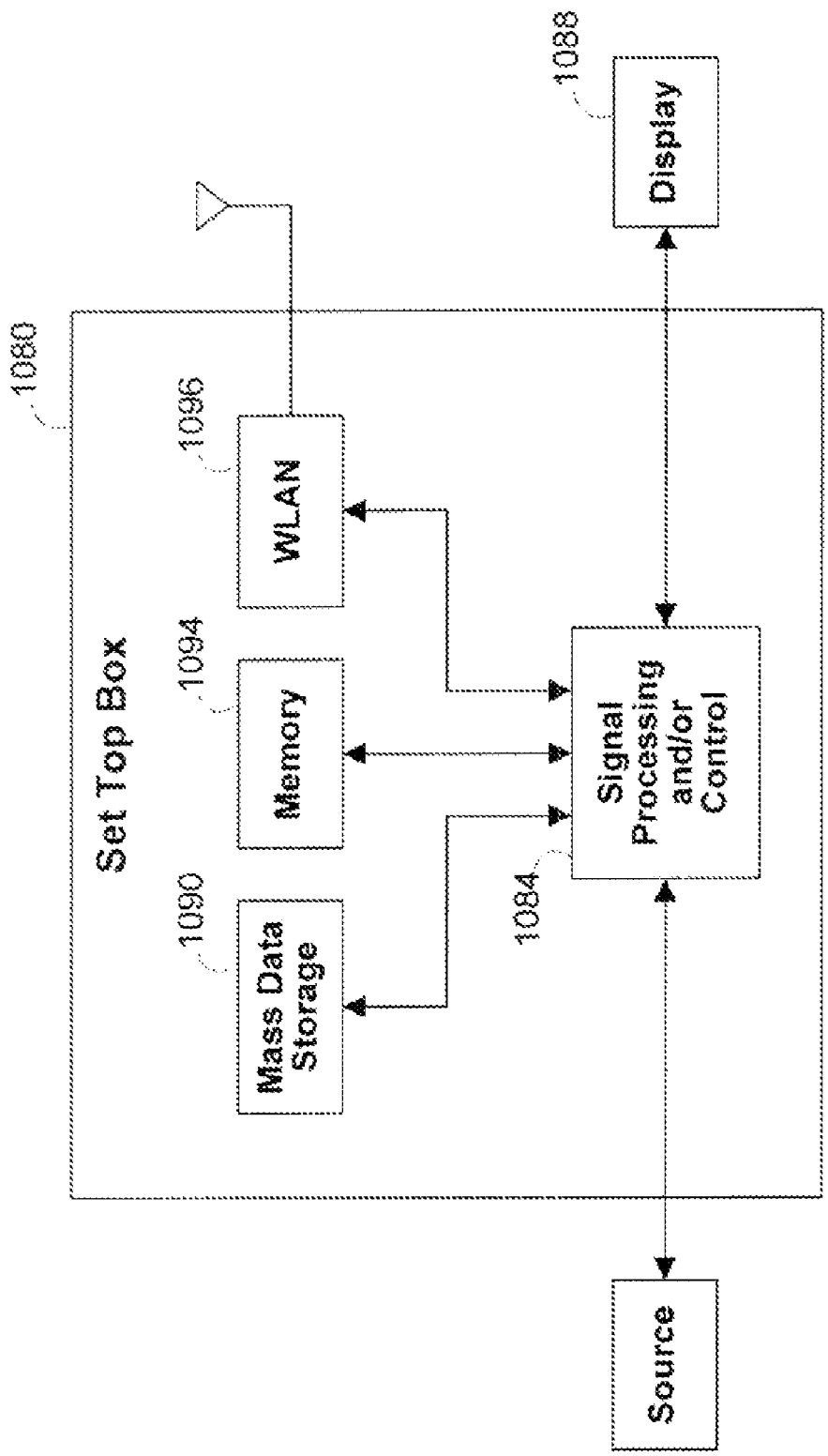
FIG. 11F is a block diagram of an exemplary set top box that may employ the present invention.

Referring now to FIG. 11F, the present invention may be implemented in a set top box 1080. The present invention may implement either or both signal processing and/or control circuits, which are generally identified in FIG. 11F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 11G:
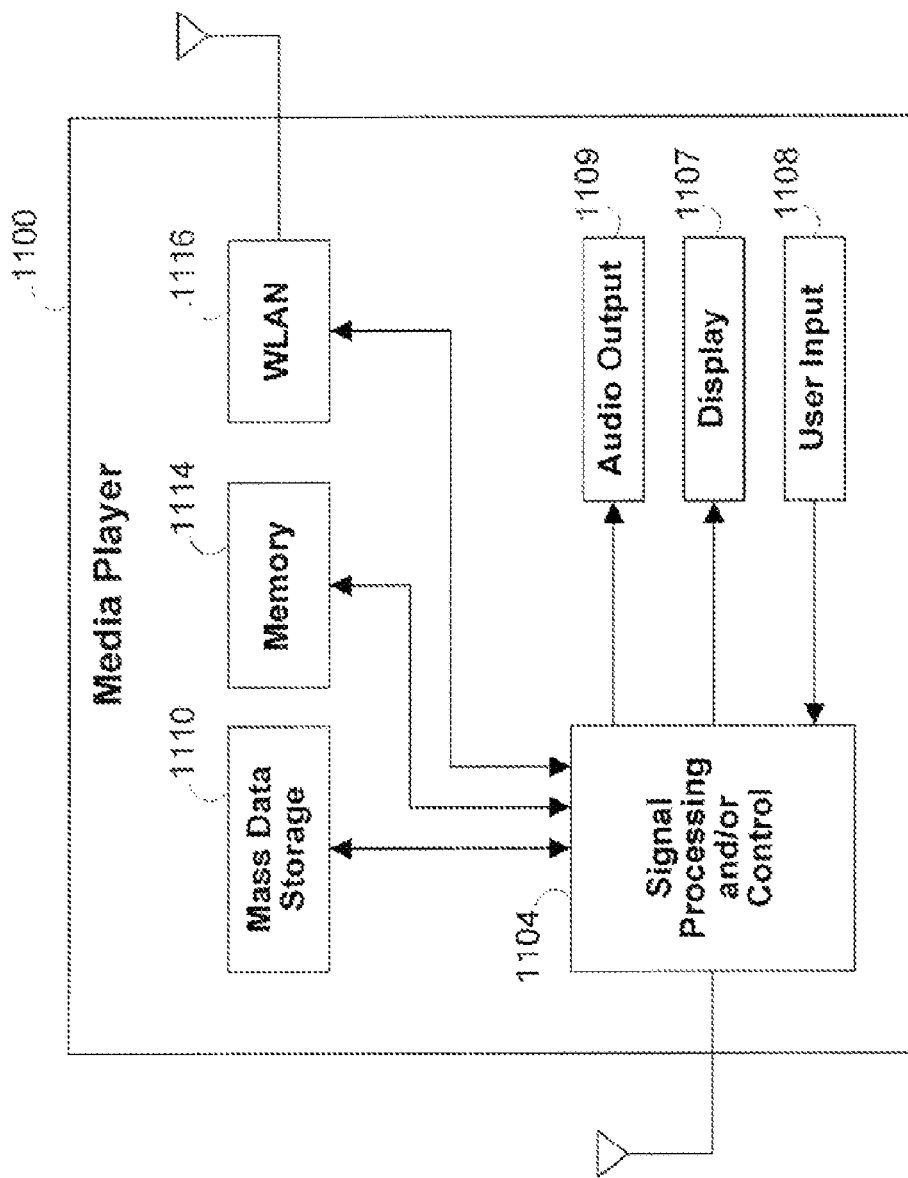
FIG. 11G is a block diagram of an exemplary media player that may employ the present invention.

Referring now to FIG. 11G, the present invention may be implemented in a media player 1100. The present invention may implement either or both signal processing and/or control circuits, which are generally identified in FIG. 11G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, what have been described thus far are systems and methods for identifying potential error locations, patterns, and likelihoods in connection with trellis-based detection/decoding. The present invention also produces soft information for detected/decoded bits. The disclosed circuits, components, and methods may be implemented using means such as digital circuitry, analog circuitry, and/or a processor architecture with programmable instructions. Additionally, components and/or methods that store information or carry signals may operate based on electrical, optical, and/or magnetic technology, and may include devices such as flip-flops, latches, random access memories, read-only memories, CDs, DVDs, disk drives, or other storage or memory means. The disclosed embodiments and illustrations are exemplary and do not limit the scone of the present invention as defined by the following claims.

What is claimed is:

1. A method for generating likelihood metrics for decoded bits using a trellis, the method comprising:
   identifying a winning path through the trellis into a winning state, wherein the winning path corresponds to the decoded bits;
   identifying a first alternate path through the trellis into the same winning state as the winning path, wherein the first alternate path differs from the winning path by at least one bit;
   determining a likelihood metric for a first bit in the decoded bits based on a first metric associated with the first alternate path; and
   determining a likelihood metric for a second bit in the decoded bits based on a second metric that is not derived based on a path that enters into the winning state.

2. The method of claim 1, further comprising
   identifying an error event update window that corresponds to a subset of bits in the decoded bits;
   selecting the first bit from the subset of bits that are within the error event update window; and
   selecting the second bit from the subset of bits that are not within the error event update window.

3. The method of claim 1, wherein the first metric is a path metric difference between the first alternate path and the winning path.

4. The method of claim 1, wherein the second metric is a predetermined value.

5. The method of claim 1, wherein the second metric is zero.

6. The method of claim 1, further comprising:
   identifying a second alternate path that does not enter into the winning state, and wherein the second metric is a path metric difference between the second alternate path and the winning path.

7. The method of claim 6, wherein the likelihood metric for the second bit is updated only if the second alternate path decision for the second bit differs from the winning path decision for the second bit.

8. The method of claim 6, wherein the second alternate path is identified based on path metrics.

9. The method of claim 8, wherein the second alternate path is the second best path in the trellis based on path metrics.

10. The method of claim 1, wherein identifying the first alternate path comprises:
    identifying a plurality of paths that enter into the winning state;
    determining a trace back depth;
    starting from the winning state, tracing back along the plurality of paths through the trellis for a number of trellis stages, wherein the number of trellis stages is based on the trace back depth; and
    identifying one alternate path from the plurality of paths to obtain the first alternate path.

11. The method of claim 10, wherein the winning path reaches the winning state through a first branch connected to the winning state, and wherein the tracing back comprises tracing back through branches other than the first branch.

12. The method of claim 1, further comprising:
    detecting information that was previously encoded based on the trellis to provide detected information;
    decoding the detected information based on the trellis to provide the decoded bits and a plurality of alternate paths; and generating at least one potential error pattern based on the winning path and at least one of the plurality of alternate paths.

13. A system for generating likelihood metrics for decoded bits using a trellis, the system comprising:
an error event generator configured to:
identify a winning path through the trellis into a winning state, wherein the winning path corresponds to the decoded bits,
identify a first alternate path through the trellis into the same winning state as the winning path, wherein the first alternate path differs from the winning path by at least one bit,
determine a likelihood metric for a first bit in the decoded bits based on a first metric associated with the first alternate path, and
determine a likelihood metric for a second bit in the decoded bits based on a second metric that is not derived based on a path that enters into the winning state.

14. The system of claim 13, wherein the error event generator is further configured to:
identify an error event update window that corresponds to a subset of bits in the decoded bits,
select the first bit from the subset of bits within the error event update window, and
select the second bit from the subset of bits that are not within the error event update window.

15. The system of claim 13, wherein the first metric is a path metric difference between the first alternate path and the winning path.

16. The system of claim 13, wherein the second metric is a predetermined value.

17. The system of claim 13, wherein the second metric is zero.

18. The system of claim 13, wherein the error event generator is configured to identify a second alternate path that does not enter into the same winning state as the winning path, and wherein the second metric is a path metric difference between the second alternate path and the winning path.

19. The system of claim 18, wherein the error event generator is configured to update the likelihood metric for the second bit only if the second alternate path decision for the second bit differs from the winning path decision for the second bit.

20. The system of claim 18, wherein the error event generator is configured to identify the second alternate path based on path metrics.

21. The system of claim 20, wherein the second alternate path is the second best path in the trellis based on the path metrics.

22. The system of claim 13, wherein the error event generator is further configured to:
identify a plurality of paths that enter into the winning state;
determine a trace back depth;
trace back along the plurality of paths through the trellis for a number of trellis stages starting from the winning state, wherein the number of trellis stages is based on the trace back depth; and
identify the first alternate path from the plurality of paths.

23. The system of claim 22, wherein the winning path reaches the winning state through a first branch connected to the winning state, and wherein the error event generator is configured to trace back through branches other than the first branch.

24. The system of claim 13, wherein the system further comprises:
a first detector to detect information that was previously encoded based on the trellis to provide detected information;
at least one decoder to decode the detected information based on the trellis to provide the decoded bits and a plurality of alternate paths; and
wherein the error event generator is operative to generate at least one potential error pattern based on the winning path and at least one of the plurality of alternate paths.

25. A system for generating likelihood metrics for decoded bits using a trellis, the system comprising:
means for identifying a winning path through the trellis into a winning state, wherein the winning path corresponds to the decoded bits;
means for identifying a first alternate path through the trellis into the same winning state as the winning path, wherein the first alternate path differs from the winning path by at least one bit;
means for determining a likelihood metric for a first bit in the decoded bits based on a first metric associated with the first alternate path; and
means for determining a likelihood metric for a second bit in the decoded bits based on a second metric that is not derived based on a path that enters into the winning state.

* * * * *